(12) United States Patent
Wu et al.

(10) Patent No.: US 11,721,590 B2
(45) Date of Patent: Aug. 8, 2023

(54) SEMICONDUCTOR DEVICE AND METHOD

(71) Applicant: Taiwan Semiconductor Manufacturing Company, Ltd., Hsinchu (TW)

(72) Inventors: Shih-Chieh Wu, Hsinchu (TW); Pang-Chi Wu, Hsinchu (TW); Kuo-Yi Chao, Hsinchu (TW); Mei-Yun Wang, Chu-Pei (TW); Hsien-Huang Liao, Hsinchu (TW); Tung-Heng Hsieh, ZhudongTown (TW); Bao-Ru Young, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/862,628

(22) Filed: Jul. 12, 2022

(65) Prior Publication Data
US 2022/0344215 A1 Oct. 27, 2022

Related U.S. Application Data

(63) Continuation of application No. 17/169,809, filed on Feb. 8, 2021, now Pat. No. 11,393,724, which is a
(Continued)

(51) Int. Cl.
*H01L 21/82* (2006.01)
*H01L 21/76* (2006.01)
(Continued)

(52) U.S. Cl.
CPC .. *H01L 21/823475* (2013.01); *H01L 21/7682* (2013.01); *H01L 21/76805* (2013.01);
(Continued)

(58) Field of Classification Search
CPC ....... H01L 21/823475; H01L 21/76805; H01L 21/7682; H01L 21/76895;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

CN 103165661 A 6/2013
CN 106098775 A 11/2016
(Continued)

*Primary Examiner* — Sheikh Maruf
(74) *Attorney, Agent, or Firm* — Slater Matsil, LLP

(57) ABSTRACT

In an embodiment, a method includes: forming a first fin extending from a substrate; forming a second fin extending from the substrate, the second fin being spaced apart from the first fin by a first distance; forming a metal gate stack over the first fin and the second fin; depositing a first inter-layer dielectric over the metal gate stack; and forming a gate contact extending through the first inter-layer dielectric to physically contact the metal gate stack, the gate contact being laterally disposed between the first fin and the second fin, the gate contact being spaced apart from the first fin by a second distance, where the second distance is less than a second predetermined threshold when the first distance is greater than or equal to a first predetermined threshold.

20 Claims, 20 Drawing Sheets

Related U.S. Application Data continuation of application No. 16/567,053, filed on Sep. 11, 2019, now Pat. No. 10,957,604.

(60) Provisional application No. 62/753,456, filed on Oct. 31, 2018.

(51) Int. Cl.
*H01L 21/8234* (2006.01)
*H01L 29/66* (2006.01)
*H01L 21/768* (2006.01)

(52) U.S. Cl.
CPC ............... *H01L 21/76895* (2013.01); *H01L 21/823431* (2013.01); *H01L 21/823437* (2013.01); *H01L 29/66545* (2013.01)

(58) Field of Classification Search
CPC ..... H01L 21/823431; H01L 21/823437; H01L 29/66545
USPC .......................................................... 438/283
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,793,193 B1 * | 10/2017 | Bonilla | H01L 29/78618 |
| 9,831,183 B2 | 11/2017 | Lin et al. | |
| 9,859,386 B2 | 1/2018 | Ho et al. | |
| 9,870,996 B1 | 1/2018 | Hung et al. | |
| 9,875,938 B2 | 1/2018 | Jeong et al. | |
| 9,984,886 B2 | 5/2018 | Kim et al. | |
| 9,985,023 B1 | 5/2018 | Liu et al. | |
| 10,026,824 B1 * | 7/2018 | Chanemougame | H01L 21/845 |
| 10,038,079 B1 | 7/2018 | Ohtou et al. | |
| 10,164,098 B2 | 12/2018 | Huang et al. | |
| 10,515,951 B2 | 12/2019 | Chang et al. | |
| 2001/0029109 A1 | 10/2001 | Maeda et al. | |
| 2003/0124873 A1 | 7/2003 | Xing et al. | |
| 2008/0305647 A1 | 12/2008 | Matsushita et al. | |
| 2008/0318442 A1 | 12/2008 | Ogawa et al. | |
| 2009/0209074 A1 | 8/2009 | Anderson et al. | |
| 2010/0224936 A1 | 9/2010 | Hokazono | |
| 2012/0119307 A1 | 5/2012 | Li et al. | |
| 2012/0146157 A1 | 6/2012 | Baumgartner et al. | |
| 2013/0154011 A1 | 6/2013 | Jou et al. | |
| 2014/0110755 A1 | 4/2014 | Colinge | |
| 2015/0060960 A1 | 3/2015 | Xie et al. | |
| 2015/0069532 A1 | 3/2015 | Xie et al. | |
| 2015/0076609 A1 | 3/2015 | Xie et al. | |
| 2015/0228776 A1 | 8/2015 | Xie | |
| 2016/0056232 A1 | 2/2016 | Kuo et al. | |
| 2017/0117411 A1 | 4/2017 | Kim et al. | |
| 2017/0148874 A1 * | 5/2017 | Ok | H01L 21/7682 |
| 2017/0330790 A1 * | 11/2017 | He | H01L 23/5222 |
| 2018/0090418 A1 * | 3/2018 | Bonilla | H01L 21/76834 |
| 2018/0182757 A1 | 6/2018 | Xie et al. | |
| 2018/0240883 A1 * | 8/2018 | Chanemougame | H01L 29/66795 |
| 2018/0331225 A1 | 11/2018 | Liaw | |
| 2019/0043959 A1 * | 2/2019 | Lee | H01L 29/6656 |
| 2020/0006228 A1 * | 1/2020 | Yang | H01L 21/76832 |

FOREIGN PATENT DOCUMENTS

| | | |
|---|---|---|
| CN | 107706233 A | 2/2018 |
| KR | 20130069296 A | 6/2013 |
| TW | 201810659 A | 3/2018 |
| TW | 201812870 A | 4/2018 |
| TW | 201830503 A | 8/2018 |
| TW | 201838180 A | 10/2018 |

* cited by examiner

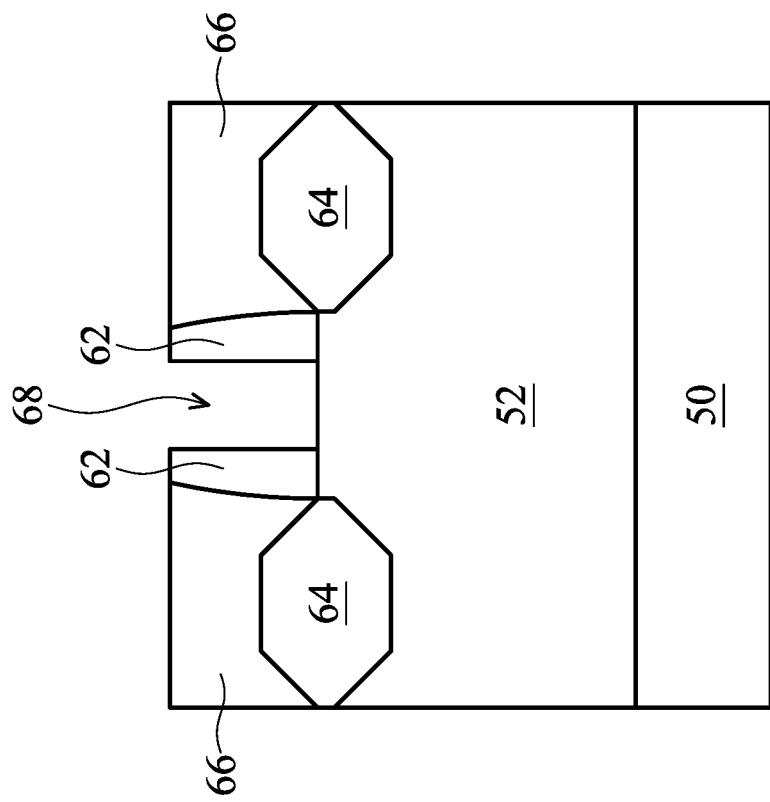
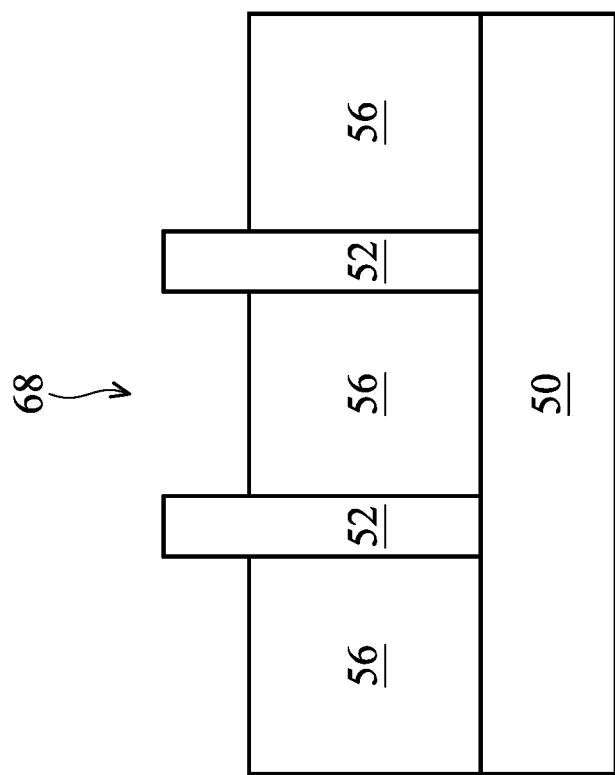
FIG. 4C
FIG. 4B

SEMICONDUCTOR DEVICE AND METHOD

PRIORITY CLAIM AND CROSS-REFERENCE

This application is a continuation of U.S. patent application Ser. No. 17/169,809 filed Feb. 8, 2021, entitled "Semiconductor Device and Method," which is a continuation of U.S. patent application Ser. No. 16/567,053 filed Sep. 11, 2019 entitled "Semiconductor Device and Method," now U.S. Pat. No. 10,957,604 issued on Mar. 23, 2021, which claims the benefit of U.S. Provisional Application No. 62/753,456, filed on Oct. 31, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C, 2A, 2B, 2C, 2D, 3A, 3B, 3C, 4A, 4B, 4C, 5A, 5B, 5C, 6A, 6B, and 6C illustrate intermediate stages in the manufacturing of FinFETs, in accordance with some embodiments.

DETAILED DESCRIPTION

Figure 1A:
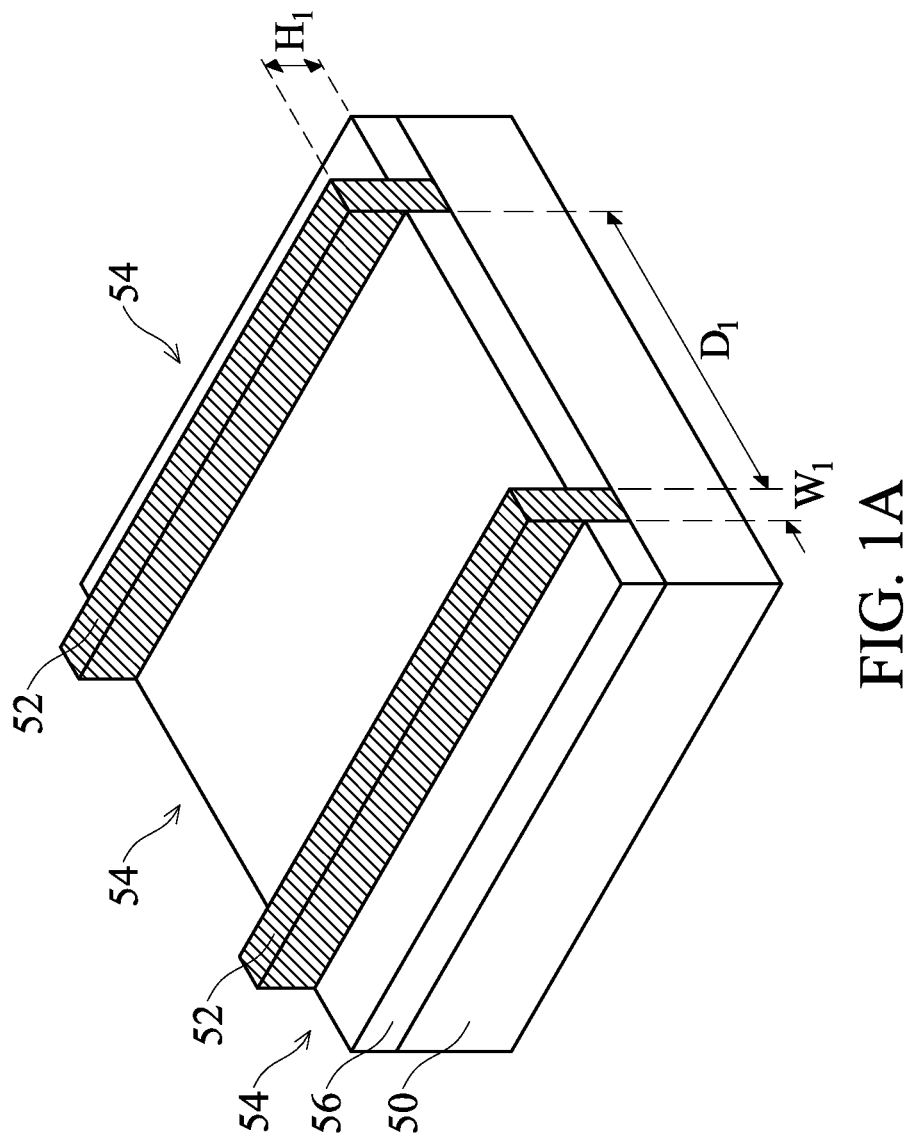

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, metal gate stacks are formed over fins, and gate contacts are formed to the metal gate stacks. In some embodiments, voids form in the metal gate stacks. The spacing between the gate contacts and fins is constrained according to the spacing between adjacent fins. The spacing between the gate contacts and ends of the metal gate stack lines is also constrained. The spacing is constrained to a value that is less than a distance at which voids typically form in the metal gate stack. Formation of the gate contacts on the voids may thus be avoided. Further, in some embodiments, the metal gate stack lines are cut during formation to avoid the formation of voids.

FIGS. 1A through 6C illustrate intermediate stages in the manufacturing of FinFETs, in accordance with some embodiments. FIGS. 1A, 2A, 3A, 4A, 5A, and 6A are three-dimensional views. FIGS. 1B, 2B, 3B, 4B, 5B, and 6B are cross-sectional views shown along a longitudinal axis of the FinFETs, e.g., perpendicular to the direction of current flow between the source/drain regions of the FinFETs, and are shown for a single FinFET. FIGS. 1C, 2C, 3C, 4C, 5C, and 6C are cross-sectional views shown along a latitudinal axis of the FinFETs, e.g., parallel to the direction of current flow between the source/drain regions of the FinFETs, and are shown for a single FinFET. FIG. 2D is a cross-sectional view shown along a longitudinal axis of the FinFETs, through source/drain regions of the FinFETs.

Some embodiments discussed herein are discussed in the context of FinFETs formed using a gate-last process. In other embodiments, a gate-first process may be used. Also, some embodiments contemplate aspects used in planar devices, such as planar FETs.

Figure 1C:
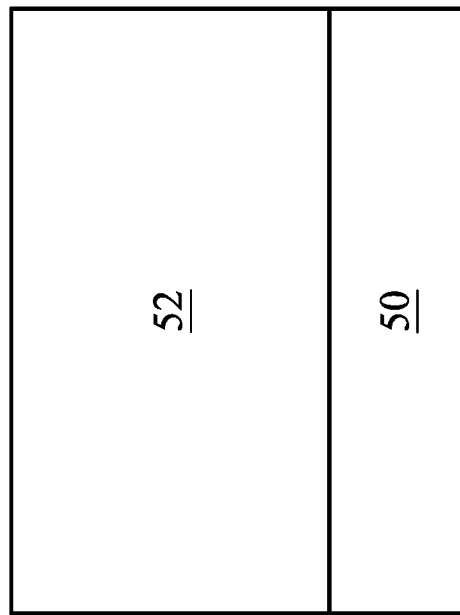
Figure 1B:
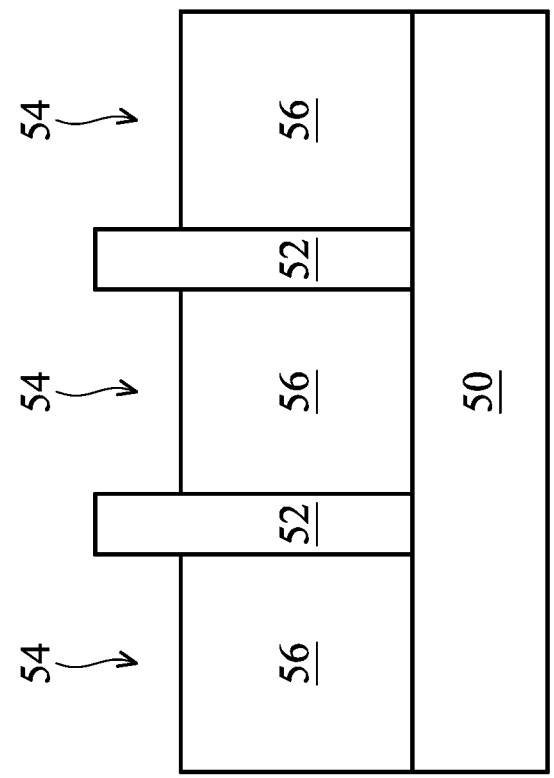

In FIGS. 1A through 1C, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Other substrates, such as a multi-layered or gradient substrate may also be used. One region of the substrate 50 is illustrated, which can be for forming n-type devices (such as NMOS transistors, e.g., n-type FinFETs) or for forming p-type devices (such as PMOS transistors, e.g., p-type FinFETs). The substrate 50 may include multiple, physically separated regions, in which any number of device features (e.g., other active devices, doped regions, isolation structures, etc.) may be formed.

Further, fins 52 are formed extending from the substrate 50. The fins 52 are semiconductor strips. In the embodiment shown, the fins 52 are an epitaxially grown semiconductor material, different from the material of the substrate 50. The fins 52 may be formed from silicon, silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In the embodiment shown, the fins 52 are formed by epitaxially growing a layer of the semiconductor material on the substrate 50, and then etching trenches 54 in the semiconductor material, with the fins 52 being formed from portions of the semiconductor material that remain unremoved. The etching may be any acceptable etch process, such as a reactive ion etch (RIE), neutral beam etch (NBE), the like, or a combination thereof. The etch may be anisotropic. In other embodiments, the fins 52 are the same material as the substrate 50, and are formed by etching trenches in the substrate 50. As discussed below, the fins 52 are used, to form channel regions of FinFETs. Although only two fins 52 are illustrated, it should be appreciated that any number of fins 52 may be formed.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 52 are formed to a width $W_1$ at the surface of the substrate 50. In some embodiments, the width $W_1$ is in the range of about 6 nm to about 600 nm. Additionally, the fins 52 are spaced apart from each other by a distance $D_1$. By spacing the fins 52 in such a fashion, the fins 52 may each form a separate channel region while still being close enough to share a common gate. As discussed further below, the distance $D_1$ is selected in such a way as to help reduce the contact resistance ($R_c$) of subsequently formed contacts to the gate of the FinFETs. In some embodiments, the distance $D_1$ is large, such as in the range of about 22 nm to about 800 nm. In some embodiments, the distance $D_1$ is small, such as in the range of about 22 nm to about 200 nm.

Further, shallow trench isolation (STI) regions 56 are formed between the fins 52. The STI regions 56 may be formed by filling the trenches 54 with a dielectric material and recessing the dielectric material in the trenches 54 to form the STI regions 56. The dielectric material may be an oxide material, a high-density plasma (HDP) oxide, or the like. The dielectric material may be formed, after an optional cleaning and lining of the trenches 54, using either a chemical vapor deposition (CVD) method, a high density plasma CVD method, or other suitable method of formation as is known in the art.

The trenches 54 may be filled by overfilling the trenches 54 and the substrate 50 with the dielectric material and then removing the excess material outside of the trenches 54 and the fins 52 through a suitable process such as chemical mechanical polishing (CMP), an etch, a combination thereof, or the like. In an embodiment, the removal process removes dielectric material overlying the fins 52, so that top surfaces of the fins 52 are exposed.

Once the trenches 54 have been filled with the dielectric material, the dielectric material may then be recessed from the top surfaces of the fins 52. The recessing may be performed to expose at least a portion of the sidewalls of the fins 52 adjacent to the top surfaces of the fins 52. The dielectric material may be recessed using a wet etch by dipping the top surfaces of the fins 52 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material is recessed such that the exposed portions of the fins 52 have a first height $H_1$. In some embodiments, the first height $H_1$ is in the range of about 40 Å to about 100 Å. Additionally, the recessing may also remove any leftover dielectric material located over the fins 52, exposing the fins 52 for further processing.

Figure 2A:
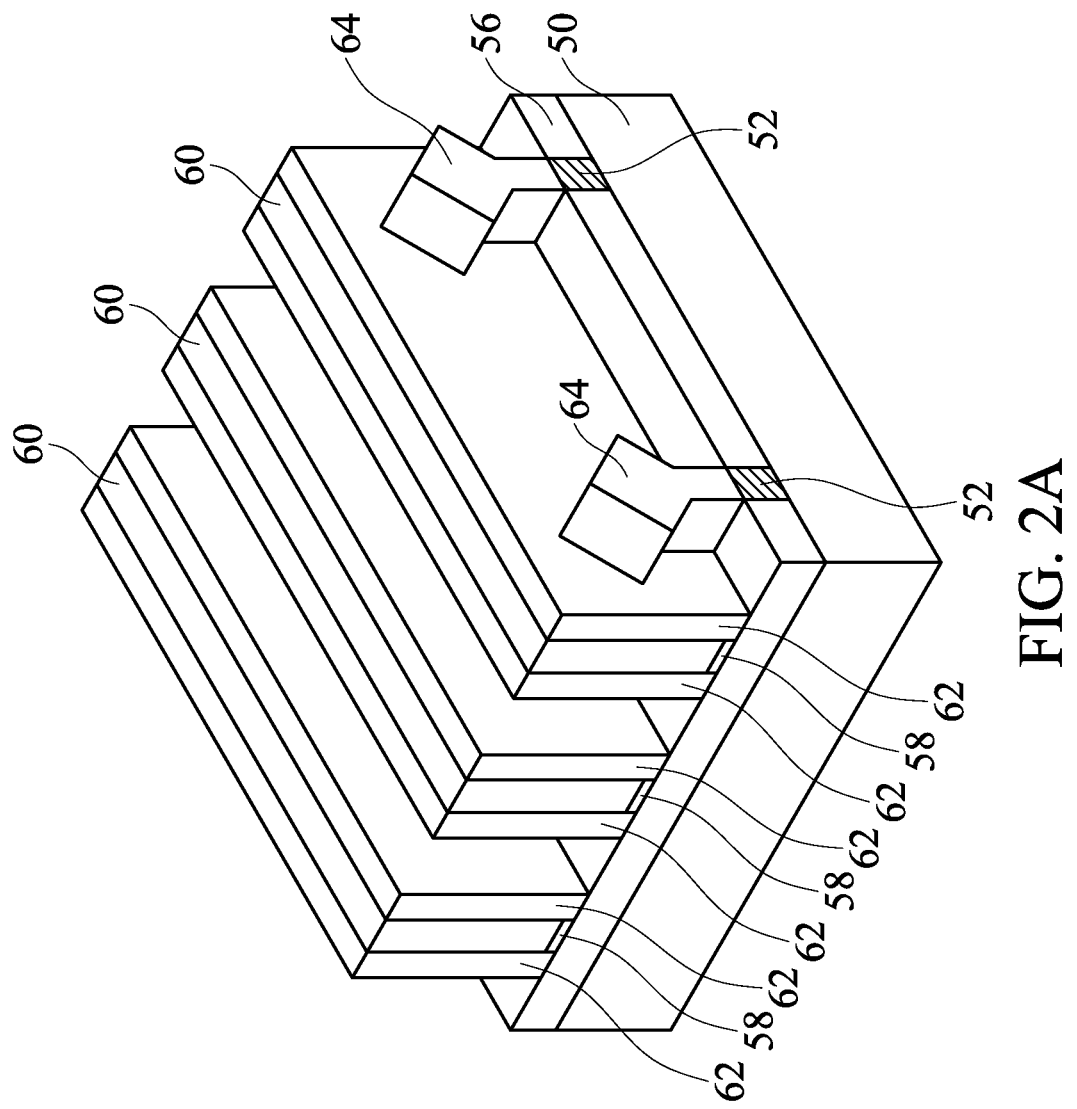
Figure 2C:
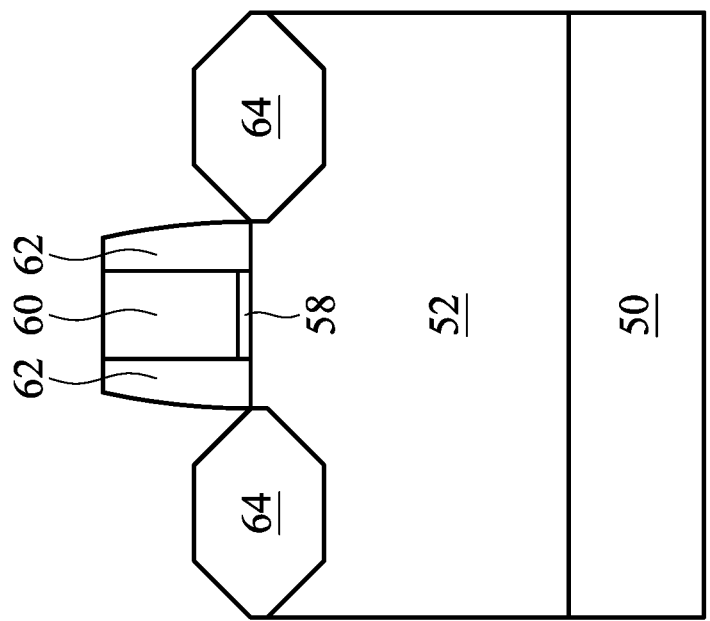
Figure 2B:
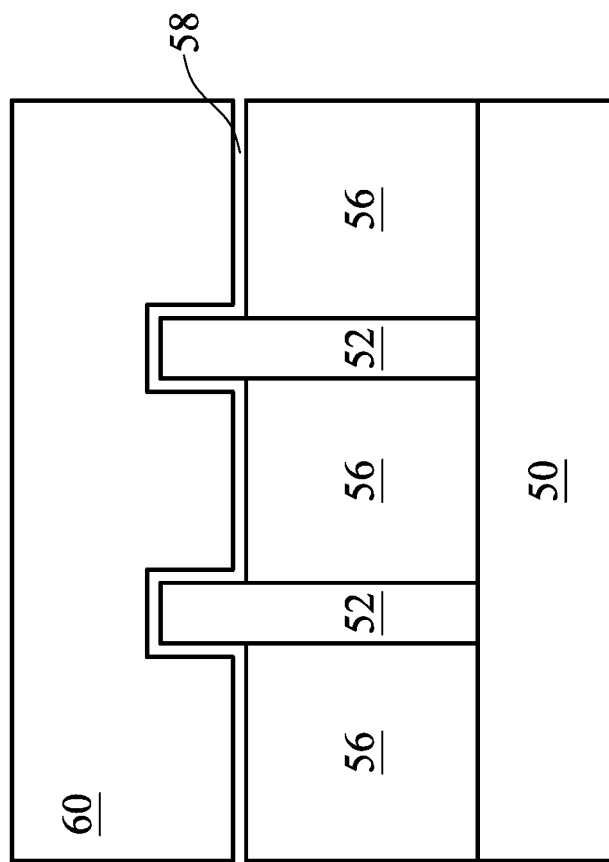
Figure 2D:
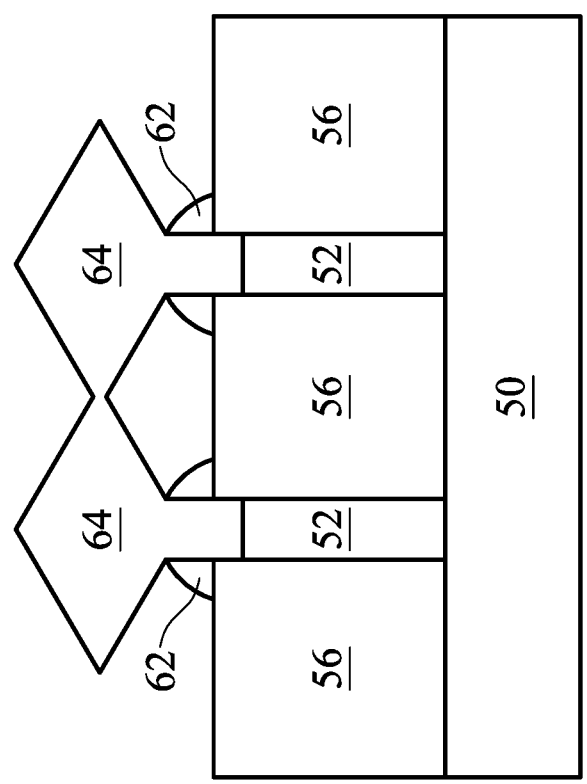

In FIGS. 2A through 2C, dummy gate dielectrics 58 and dummy gate electrodes 60 are formed over each of the fins 52. In some embodiments, a dummy gate dielectric layer is formed by thermal oxidation, chemical vapor deposition, sputtering, or any other methods known and used in the art for forming dielectric layers. A dummy gate electrode layer is then formed on the dummy gate dielectric layer. The dummy gate electrode layer may be formed from a conductive material such as polycrystalline-silicon (polysilicon), poly-crystalline silicon-germanium (poly-SiGe), metallic nitrides, metallic silicides, metallic oxides, metals, or the like, and may be formed by a deposition process such as physical vapor deposition (PVD), chemical vapor deposition (CVD), sputter deposition, or the like. The dummy gate electrode layer and dummy gate dielectric layer are then patterned, such as by acceptable photolithography and etching processes, with remaining portions of the dummy gate dielectric layer and dummy gate electrode layer, respectively, forming the dummy gate dielectrics 58 and dummy gate electrodes 60.

Further, gate spacers 62 are formed on opposing sides of the dummy gate electrodes 60, over each of the fins 52. In some embodiments, the gate spacers 62 are formed by blanket depositing a spacer layer, such as a layer of silicon nitride, silicon oxide, silicon oxynitride, silicon carbide, or the like by a deposition process such as CVD or plasma enhanced CVD (PECVD). The spacer layer is then patterned, such as by one or more etches to remove horizontal portions of the spacer layer, with remaining vertical portions of the spacer layer forming the gate spacers 62.

Further, epitaxial source/drain regions 64 are formed in the fins 52, such that each dummy gate electrode 60 is laterally disposed between respective neighboring pairs of the epitaxial source/drain regions 64. The epitaxial source/drain regions 64 exert stress in what will be the channel regions of the resulting FinFETs, thereby improving performance. The gate spacers 62 separate the epitaxial source/drain regions 64 from the dummy gate electrodes 60 by an appropriate lateral distance so that the epitaxial source/drain regions 64 do not short out subsequently formed gates of the resulting FinFETs. The epitaxial source/drain regions 64 are formed by etching recesses in the fins 52. Then, the epitaxial source/drain regions 64 in the region are epitaxially grown in the recesses. The epitaxial source/drain regions 64 may include any acceptable material, such as appropriate for n-type or p-type FinFETs. For example, when n-type FinFETs are formed, the epitaxial source/drain regions 64 may include materials exerting a tensile strain in the channel region of the fins 52, such as silicon, SiC, SiCP, SiP, or the like. Likewise, when p-type FinFETs are formed, the epitaxial source/drain regions 64 may include materials exerting a compressive strain in the channel region of the fins 52, such as SiGe, SiGeB, Ge, GeSn, or the like. The epitaxial source/drain regions 64 may have surfaces raised from respective surfaces of the fins 52 and may have facets.

As a result of the epitaxy processes used to form the epitaxial source/drain regions 64, upper surfaces of the epitaxial source/drain regions 64 have facets which expand laterally outward beyond sidewalls of the fins 52. In the embodiment shown in FIGS. 2A through 2C, adjacent epitaxial source/drain regions 64 remain separated after the epitaxy process is completed. In other embodiments, such as that shown in FIG. 2D, these facets cause adjacent epitaxial source/drain regions 64 of a same FinFET to merge.

Figure 3A:
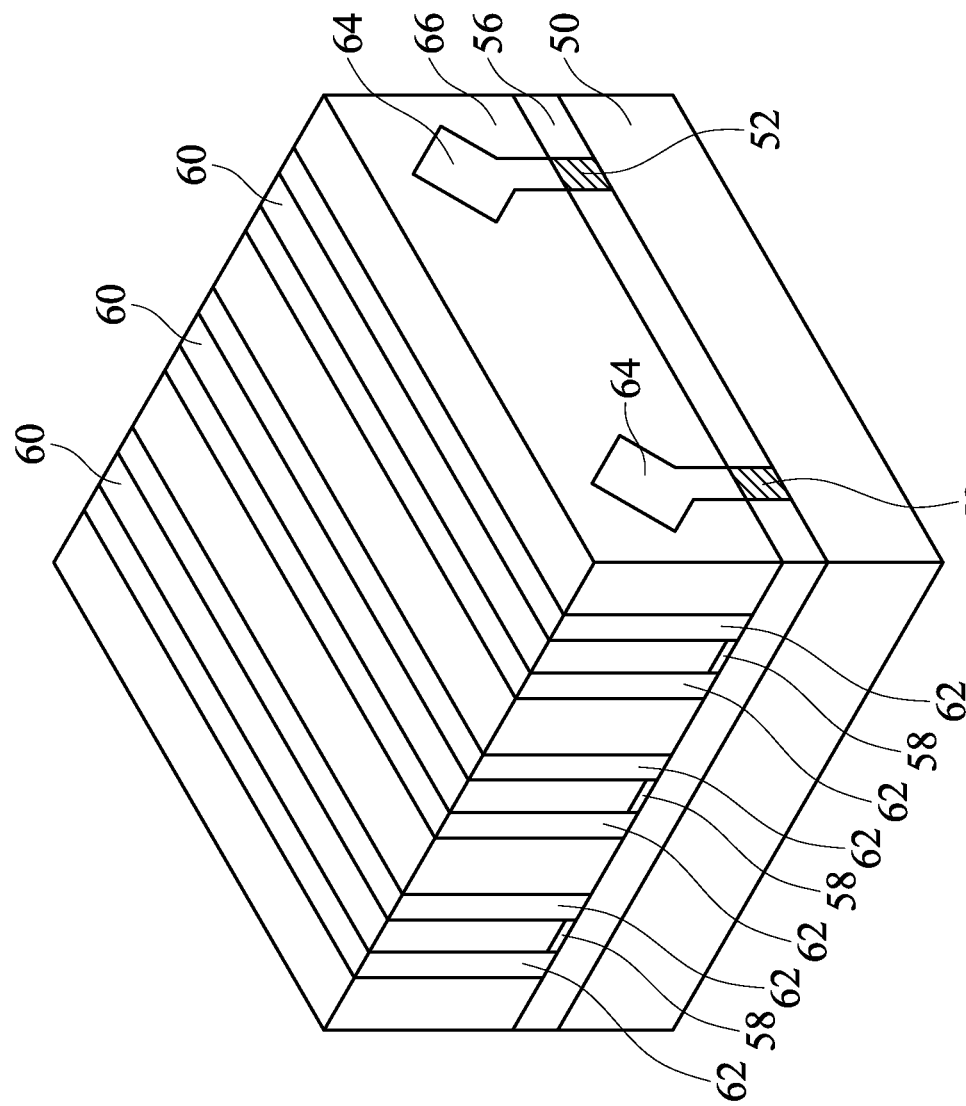
Figure 3C:
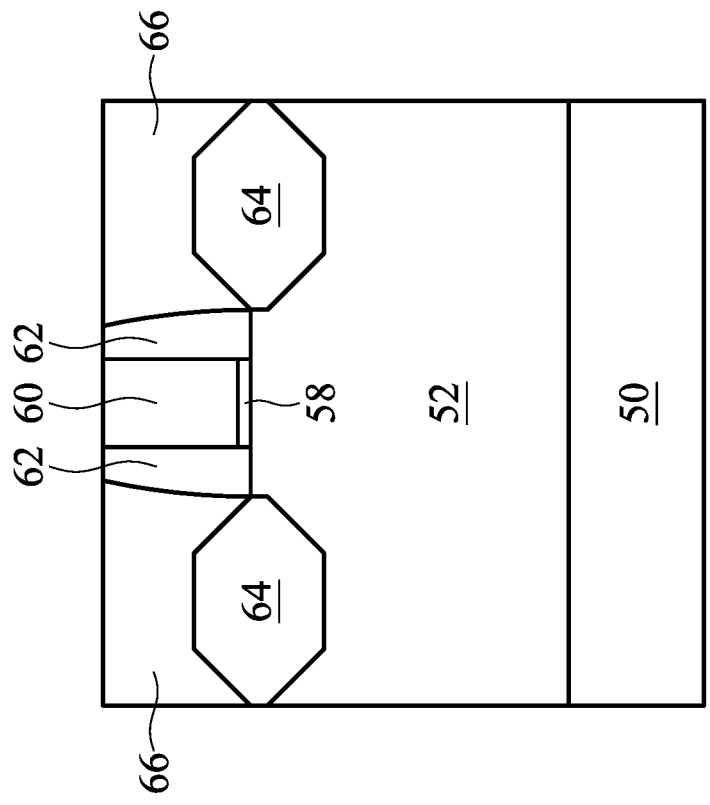
Figure 3B:
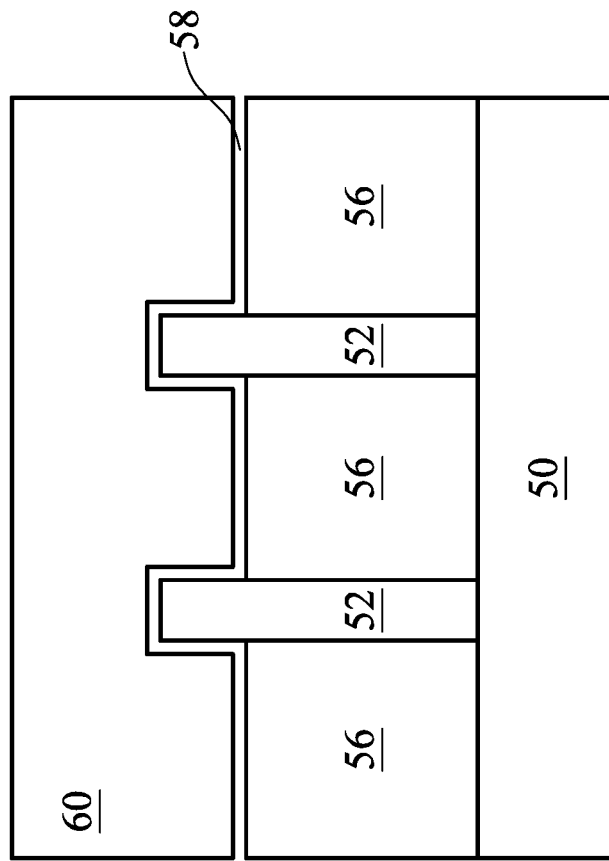

In FIGS. 3A through 3C, a first inter-layer dielectric (ILD) 66 is deposited over the substrate 50. The first ILD 66 may be formed of a dielectric material, and may be deposited by any suitable method, such as CVD, PECVD, or flowable CVD (FCVD). Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) is disposed between the first ILD 66 and the epitaxial source/drain regions 64, the gate spacers 62, and the dummy gate electrodes 60. The CESL may comprise a dielectric material, such as, silicon nitride, silicon oxide, silicon oxynitride, or the like, having a different etch rate than the material of the first ILD 66. In some embodiments, a planarization process, such as a CMP, is performed to level the top surface of the first ILD 66 with the top surfaces of the dummy gate electrodes 60 and the gate spacers 62.

Figure 4A:
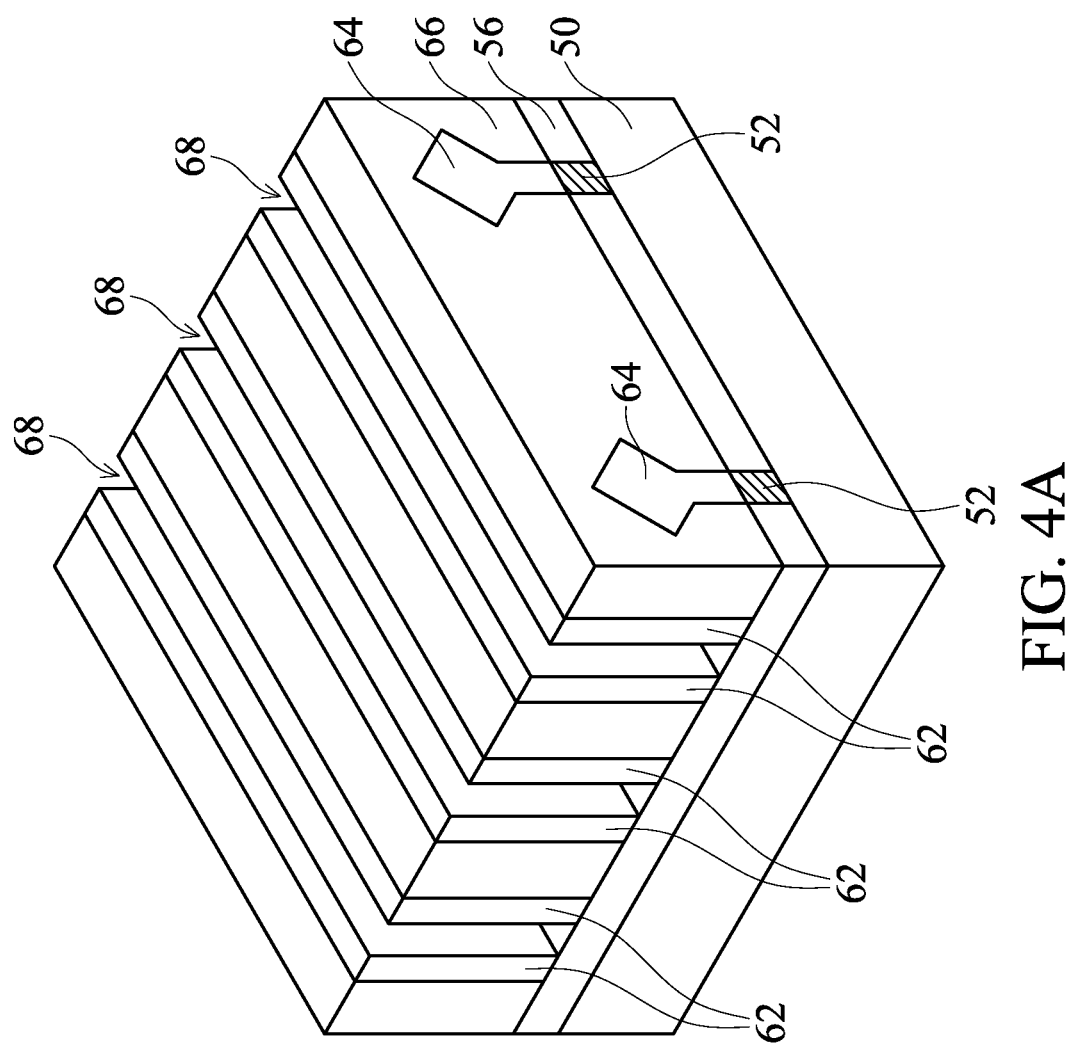

In FIGS. 4A through 4C, the dummy gate electrodes 60 and dummy gate dielectrics 58 are removed in one or more etching step(s), so that recesses 68 are formed. Each recess 68 exposes a channel region of a respective fin 52. Each channel region is laterally disposed between neighboring pairs of the epitaxial source/drain regions 64. During the removal, the dummy gate dielectrics 58 may be used as etch stop layers when the dummy gate electrodes 60 are etched. The dummy gate dielectrics 58 may then be optionally removed after the removal of the dummy gate electrodes 60.

Figure 5A:
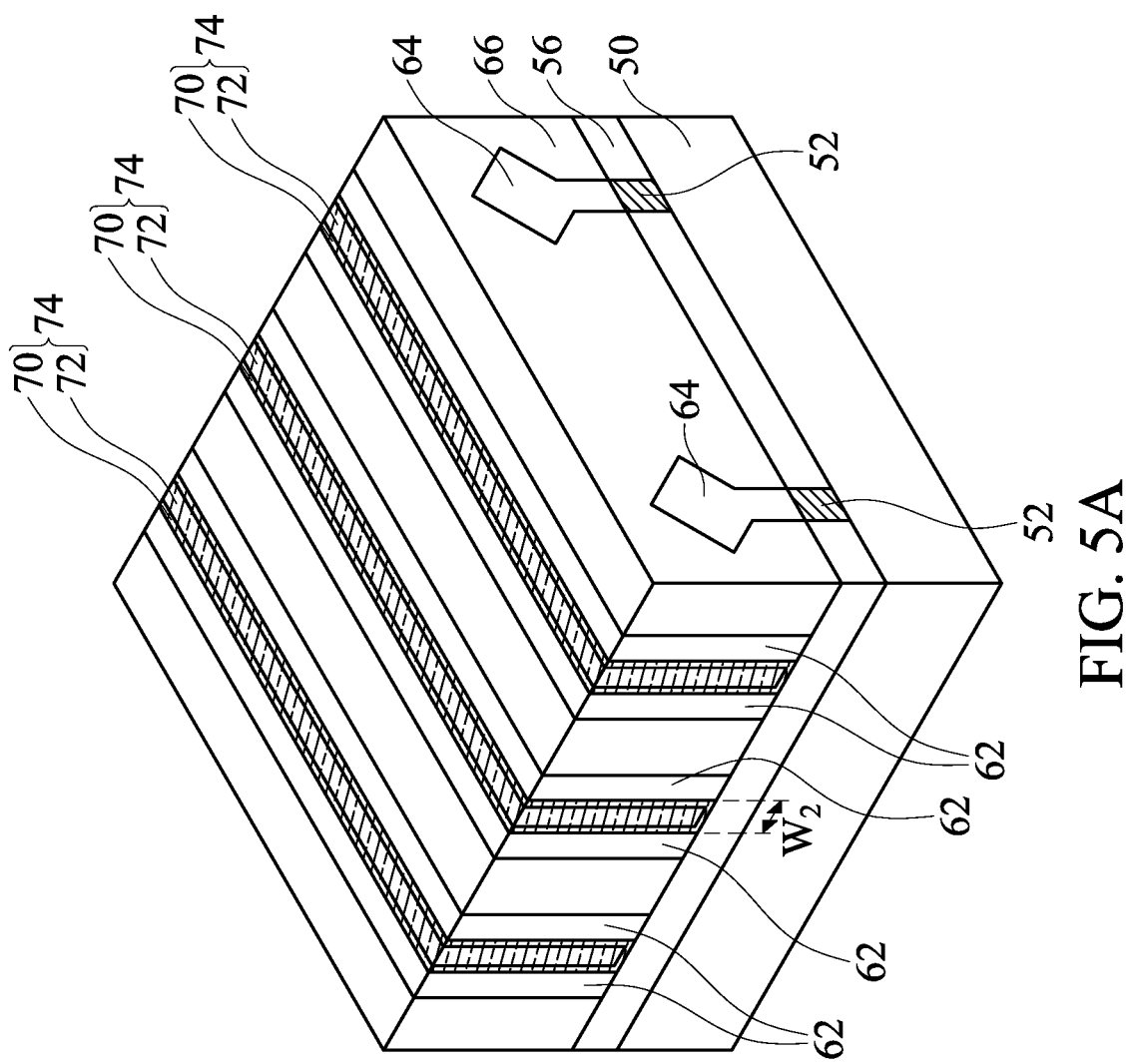
Figure 5C:
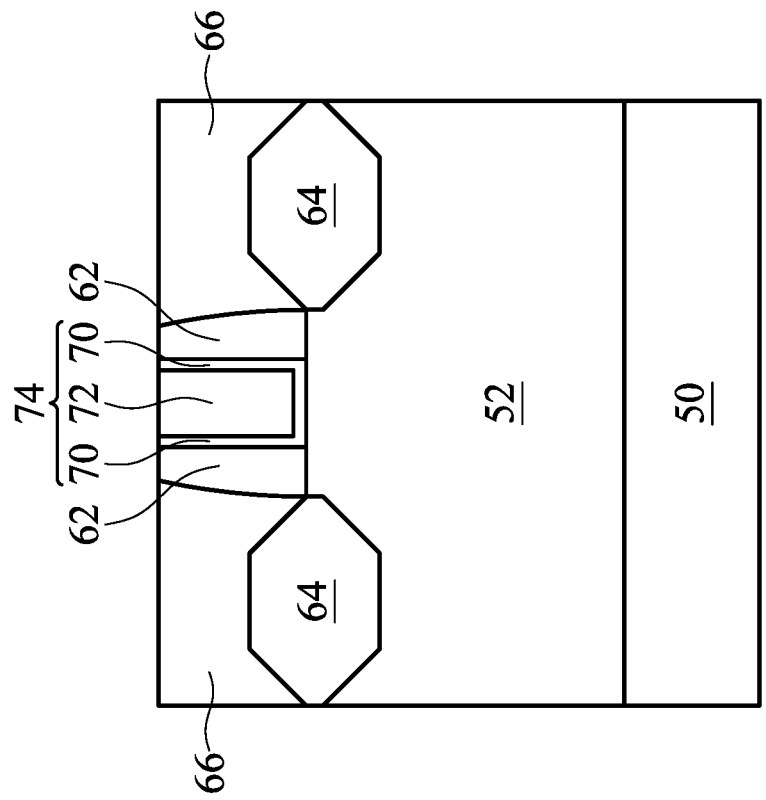
Figure 5B:
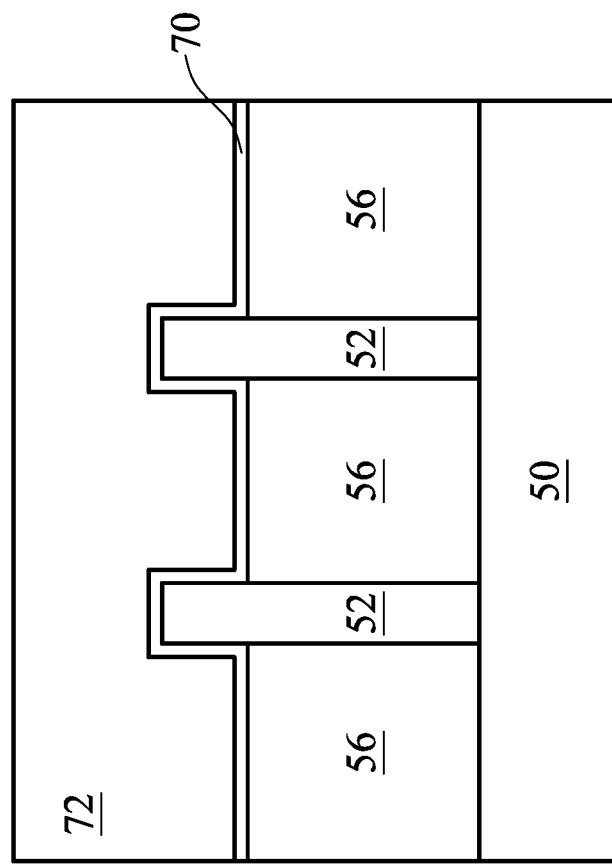

In FIGS. 5A through 5C, gate dielectrics 70 and gate electrodes 72 are formed for replacement gates. The gate dielectrics 70 are conformally deposited in the recesses 68, such as on the top surfaces and the sidewalls of the fins 52 and on sidewalls of the gate spacers 62. The gate dielectrics 70 may also be formed on top surfaces of the first ILD 66. In accordance with some embodiments, the gate dielectrics 70 comprise silicon oxide, silicon nitride, or multilayers thereof. In some embodiments, the gate dielectrics 70 include a high-k dielectric material, and in these embodiments, the gate dielectrics 70 may have a k value greater than about 7.0, and may include a metal oxide or a silicate of Hf, Al, Zr, La, Mg, Ba, Ti, Pb, and combinations thereof. The formation methods of the gate dielectrics 70 may include Molecular-Beam Deposition (MBD), atomic layer deposition, PECVD, and the like. In embodiments where portions of the dummy gate dielectrics 58 remain in the recesses 68, the gate dielectrics 70 include a material of the dummy gate dielectrics 58 (e.g., $SiO_2$).

The gate electrodes 72 are deposited over the gate dielectrics 70, respectively, and fill the remaining portions of the recesses 68. The gate electrodes 72 may include a metal-containing material such as TiN, TiO, TaN, TaC, Co, Ru, Al, W, combinations thereof, or multi-layers thereof. The gate electrodes 72 may be formed by a deposition process such as atomic layer deposition (ALD). The gate electrodes 72 may include any number of liner layers, work function tuning layers, and fill materials. After the filling of the gate electrodes 72, a planarization process, such as a CMP, may be performed to remove the excess portions of the gate dielectrics 70 and the material of the gate electrodes 72, which excess portions are over the top surface of the first ILD 66. The remaining portions of material of the gate electrodes 72 and the gate dielectrics 70 thus form replacement gates of the resulting FinFETs. The gate electrodes 72 and the gate dielectrics 70 may be collectively referred to as gate stacks 74. The gate stacks 74 extend along sidewalls of a channel region of the fins 52.

After formation, the gate stacks 74 have a width $W_2$. In some embodiments, the width $W_2$ is in the range of about 6 nm to about 300 nm. As discussed further below, the distance $D_1$ between the fins 52 (see FIG. 1A) is selected according to the width $W_2$ of the gate stacks 74 that are formed.

Figure 6A:
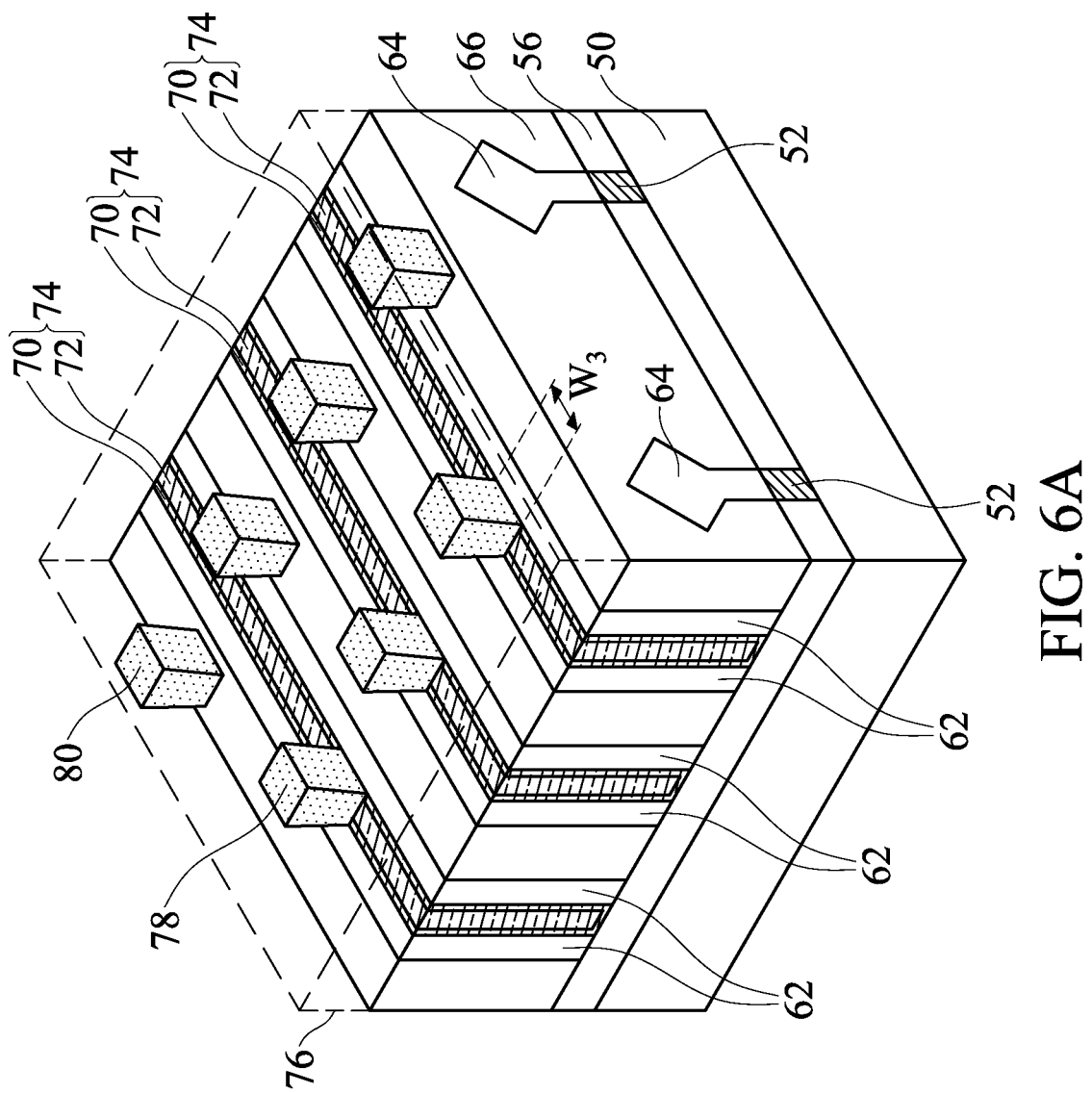
Figure 6C:
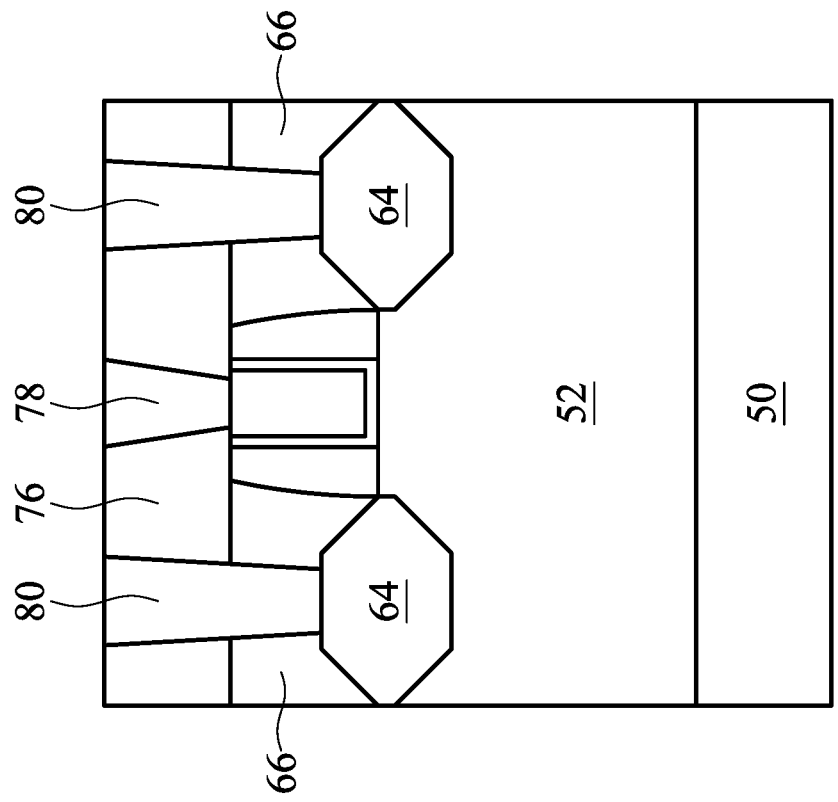
Figure 6B:
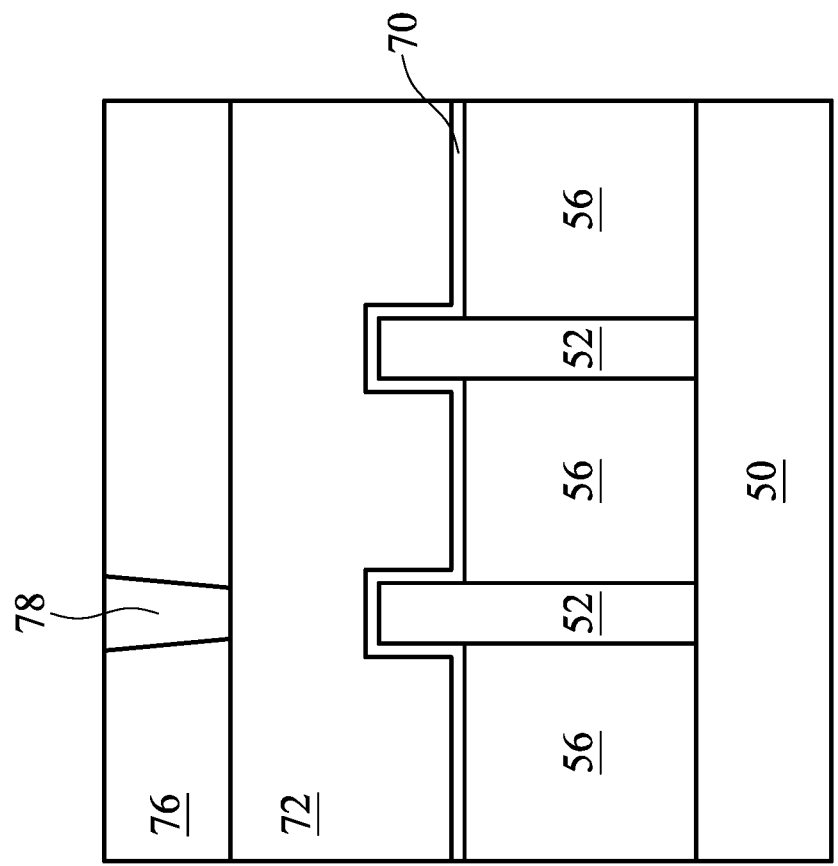

In FIGS. 6A through 6C, a second ILD 76 is deposited over the first ILD 66. In some embodiments, the second ILD 76 is a flowable film formed by a flowable CVD method. In some embodiments, the second ILD 76 is formed of a dielectric material such as PSG, BSG, BPSG, USG, or the like, and may be deposited by any suitable method, such as CVD and PECVD.

Further, gate contacts 78 and source/drain contacts 80 are formed through the second ILD 76 and the first ILD 66. Openings for the source/drain contacts 80 are formed through the first ILD 66 and second ILD 76, and openings for the gate contacts 78 are formed through the second ILD 76 (and optionally the gate mask, if formed). The gate contacts 78 (or source/drain contacts 80) may include a liner (such as a diffusion barrier layer, an adhesion layer, or the like) and a conductive material. The openings may be formed using acceptable photolithography and etching techniques. The liner and the conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. The conductive material may be formed by a deposition process such as CVD. A planarization process, such as a CMP, may be performed to remove excess material from a surface of the second ILD 76. The remaining liner and conductive material forms the source/drain contacts 80 and gate contacts 78 in the openings. An anneal process may be performed to form a silicide at the interface between the epitaxial source/drain regions 64 and the source/drain contacts 80. The source/drain contacts 80 are physically and electrically coupled to the epitaxial source/drain regions 64, and the gate contacts 78 are physically and electrically coupled to the gate electrodes 72. The source/drain contacts 80 and gate contacts 78 may be formed in different processes, or may be formed in the same process. Although shown as being formed in the same cross-sections, it should be appreciated that each of the source/drain contacts 80 and gate contacts 78 may be formed in different cross-sections, which may avoid shorting of the contacts.

After formation, the gate contacts 78 have a width $W_3$. In some embodiments, the width $W_3$ is in the range of about 10 nm to about 20 nm. As discussed further below, dimensions of the gate stacks 74 are selected according to the width $W_3$ of the gate contacts 78.

Figure 7B:
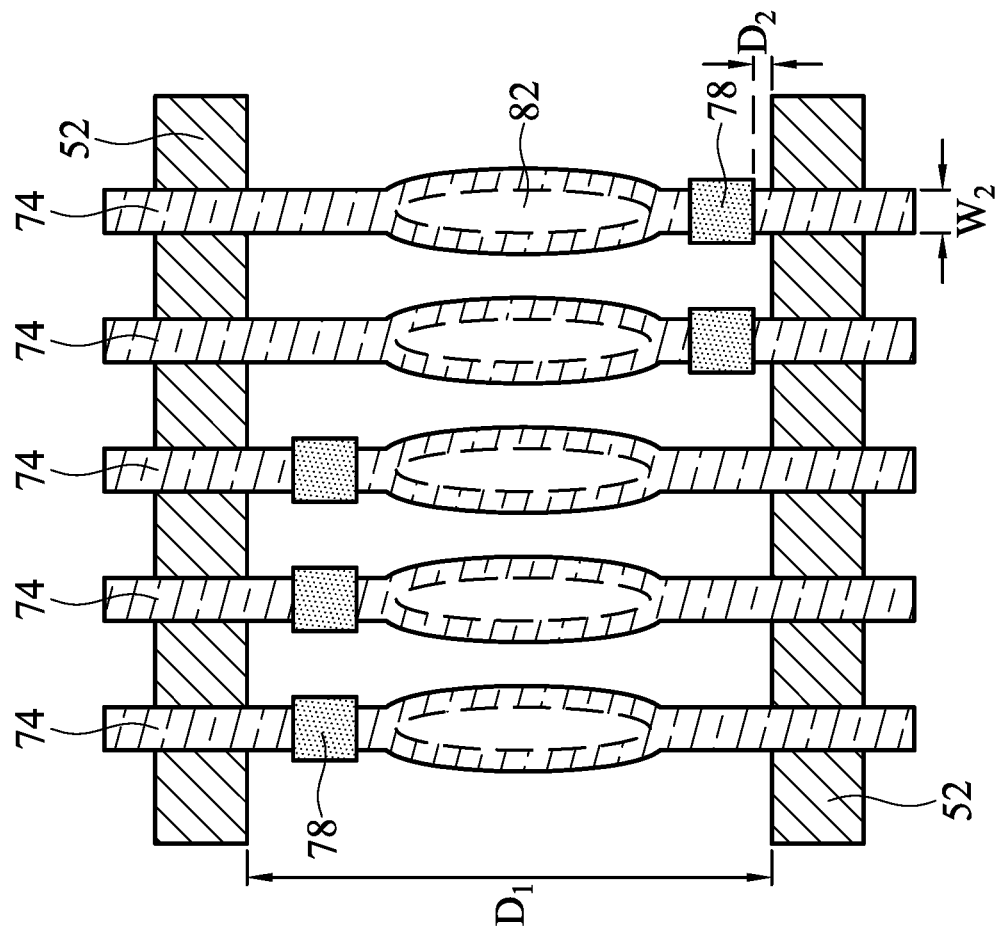
FIGS. 7A and 7B illustrate a gate contact layout, in accordance with some embodiments.
Figure 7A:
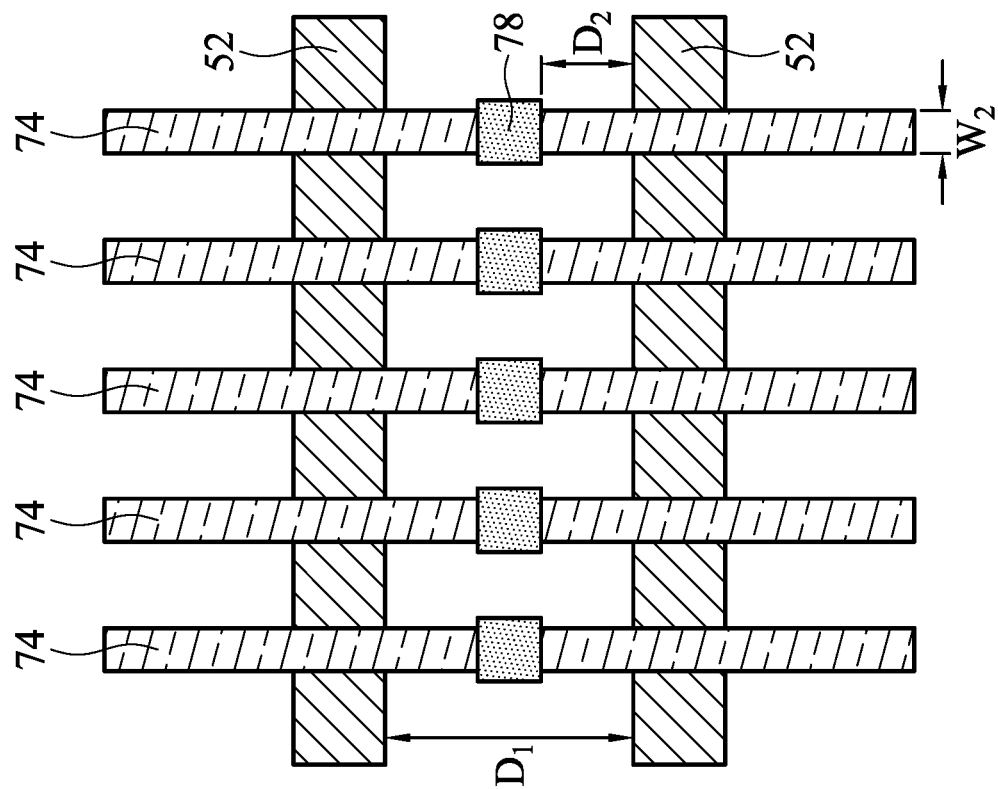

FIGS. 7A and 7B illustrate a gate contact 78 layout, in accordance with some embodiments. FIGS. 7A and 7B are top-down views, showing some features of the structure of FIG. 6A through 6C. In particular, multiple gate stacks 74 are shown, with each respective gate stack 74 extending over two fins 52. The gate contacts 78 physically couple the gate stacks 74, and are disposed a distance $D_2$ from a closest one of the fins 52. FIG. 7A shows a scenario where the distance $D_1$ between the fins 52 is small, e.g., where the distance $D_1$ is less than a predetermined threshold (discussed further below). As discussed above, a small distance $D_1$ can be in the range of about 22 nm to about 200 nm. FIG. 7B shows a scenario where the distance $D_1$ between the fins 52 is large, e.g., where the distance $D_1$ is greater than the predetermined threshold (discussed further below). As discussed above, a large distance $D_1$ can be in the range of about 22 nm to about 800 nm.

The width $W_2$ of the gate stacks 74 is sometimes referred to as the critical dimension of the gate stacks 74. At smaller critical dimensions, portions of the gate stacks 74 may be deformed. FIG. 7B is a top-down view of deformed gate stacks 74. The deformed gate stacks 74 each include a void 82. Portions of the gate stacks 74 deform because the coefficient of thermal expansion (CTE) of the gate stacks 74 is smaller than the CTE of surrounding dielectric materials (e.g., of the first ILD 66 and STI regions 56 (see FIGS. 6A through 6C)). After thermal processing, the surrounding dielectric may shrink more than the fins 52. The shrinking of the surrounding dielectric pulls apart the gate stacks 74, causing the voids 82 to be formed. The amount of deformation depends on the volume of the surrounding dielectric. Portions of the gate stacks 74 distal the fins 52 are surrounded by a greater volume of dielectric, and so more deformation of these portions occurs. Portions of the gate stacks 74 proximate the fins 52 are surrounded by a lesser volume of dielectric, and so less (or substantially no) deformation of these portions occurs. When the distance $D_1$ between fins 52 is small (as in FIG. 7A), substantially no deformation of the gate stacks 74 occurs between the fins 52. When the distance $D_1$ between fins 52 is large (as in FIG. 7B), deformation of the gate stacks 74 occurs between the fins 52.

Because of deformation, the gate stacks 74 have multiple widths. The width $W_2$ of the gate stacks 74 is the width of the un-deformed portions of the gate stacks 74, e.g., the widths of the portions over the fins 52. In other words, the width $W_2$ is the narrowest width the gate stacks 74, as measured at the narrowest portions of the gate stacks 74.

Formation of the voids 82 does not prevent the gate stacks 74 from properly functioning. However, the voids 82 have a high k-value by nature of being air or a vacuum. Forming the gate contacts 78 on the voids 82 results in an increased interface resistance between the gate contacts 78 and gate stacks 74. The contact resistance ($R_c$) of the gate contacts 78 is largely determined by the interface resistance between the gate contacts 78 and gate stacks 74, and that interface resistance may increase with smaller contact areas, e.g., when the gate stacks 74 are small. The contact area may be further reduced when the gate contacts 78 are on the voids 82, thus increasing the contact resistance of the gate contacts 78.

In accordance with some embodiments, the gate contacts 78 are formed physically coupling portions of the gate stacks 74 that are substantially free from voids 82. The contact area of the gate contacts 78 may thus be increased, thereby decreasing the contact resistance of the gate contacts 78. During a design process, the distance $D_2$ is determined according to the distance $D_1$. In particular, when the distance $D_1$ is greater than a first predetermined threshold $T_1$, the distance $D_2$ is constrained to be less than a second predetermined threshold $T_2$. FIG. 7A shows a scenario where the distance $D_1$ is less than the first predetermined threshold $T_1$, and so the distance $D_2$ is unconstrained. FIG. 7B shows a scenario where the distance $D_1$ is greater than the first predetermined threshold $T_1$, and so the distance $D_2$ is constrained. The first predetermined threshold $T_1$ and second predetermined threshold $T_2$ are defined as multiples of the width $W_2$ of the gate stacks 74. In some embodiments, the first predetermined threshold $T_1$ is in a range of about 35 to about 40 times the width $W_2$ of the gate stacks 74, and the second predetermined threshold $T_2$ is in a range of about 10 to about 13 times the width $W_2$ of the gate stacks 74. Further, a ratio of the first predetermined threshold $T_1$ to the second predetermined threshold $T_2$ can be in the range of about 3 to about 5.

Figure 8:
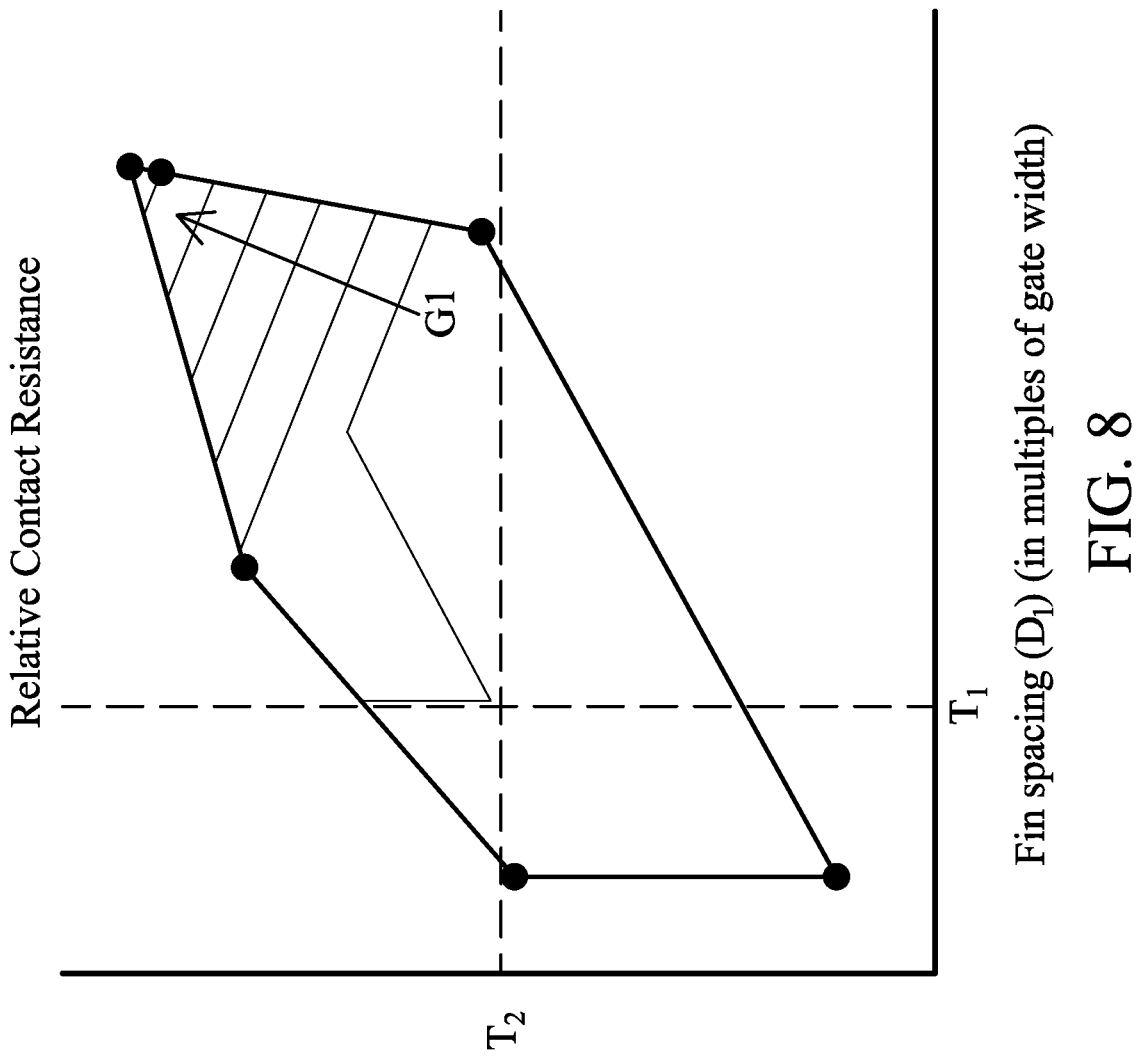
FIG. 8 illustrates experimental data for a gate contact layout, in accordance with some embodiments.

FIG. 8 is a heat map showing experimental data for the gate contact 78 layout of FIGS. 7A and 7B. In FIG. 8, the X-axis plots spacing between adjacent fins 52 (e.g., the distance $D_1$), the Y-axis plots spacing between a gate contact 78 and an adjacent fin 52 (e.g., the distance $D_2$), and values on the heat map plot the relative contact resistance. For example, the X-axis can be in a range of about 15 to about 75, and the Y-axis can be in a range of about 5 to about 20. As shown, when the distance $D_1$ was less than the first predetermined threshold $T_1$, all values for the distance $D_2$ resulted in a low contact resistance. However, when the distance $D_1$ was greater than the first predetermined threshold $T_1$, values for the distance $D_2$ that were greater than the second predetermined threshold $T_2$ resulted in a rapidly-increasing relative contact resistance along gradient $G_1$. For example, in embodiments where the width $W_2$ is about 6 nm, the distance $D_2$ is constrained to being less than about 70 nm when the distance $D_1$ is greater than or equal to about 216 nm, and the distance $D_2$ is unconstrained when the distance $D_1$ is less than about 216 nm. Constraining the distances according to the experimental results shown in FIG. 8 allows the gate contacts 78 to be placed without substantially increasing the contact resistance.

The embodiments described in FIGS. 7A and 7B may be combined on a same substrate. For example, in a first region of the substrate, the distance $D_1$ between fins 52 may be constrained to less than the first predetermined threshold $T_1$. Such a constraint may prevent or reduce the formation of voids 82 in the first region. Likewise, in a second region of the substrate, the distance $D_1$ between fins 52 may be greater than the first predetermined threshold $T_1$, and the distance $D_2$ between the fins 52 and gate contacts 78 is constrained to less than the second predetermined threshold $T_2$. Such a constraint may help avoid forming the gate contacts 78 on voids 82 in the second region.

As used herein, "constraining" the widths $W_1$ and $W_2$ refers to imposing constraints during a design process for the fins 52 and gate contacts 78. After the design process is completed, the design may be stored in, e.g., a cell library. The cell library may then be used to manufacture a corresponding FinFET.

Figure 9B:
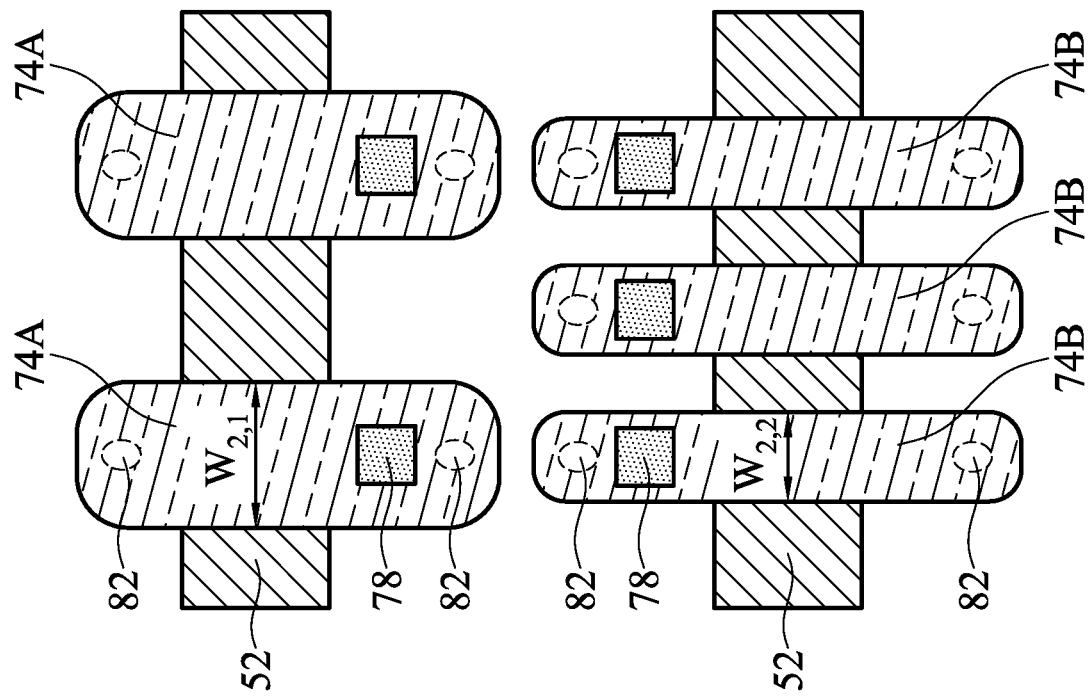
FIGS. 9A and 9B illustrate a gate contact layout, in accordance with some other embodiments.
Figure 9A:
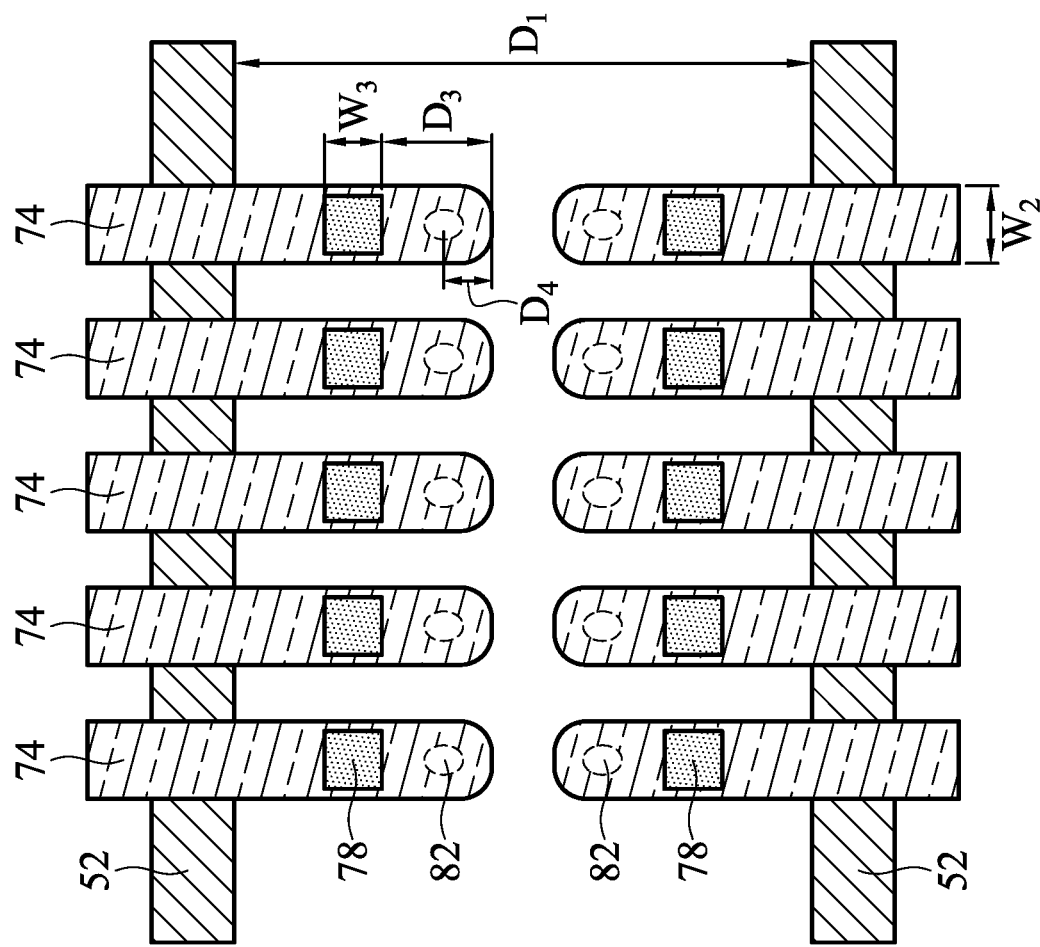

FIG. 9A illustrates a gate contact 78 layout, in accordance with some other embodiments. FIG. 9A is a top-down view, showing some features of the structure of FIGS. 6A through 6C. In particular, two of the fins 52 are shown, with each respective fin 52 being adjacent the end of the metal lines that form the gate stacks 74. The gate contacts 78 physically couple the gate stacks 74, and are disposed a distance $D_3$ from the ends of the metal lines.

When forming the gate stacks 74, voids 82 may also be formed at the ends of the metal lines. As noted above, the dummy gate dielectrics 58 and dummy gate electrodes 60 are replaced by forming recesses 68 exposing channel regions of the fins 52, and forming the gate stacks 74 in the recesses 68. The etching step(s) for forming the recesses 68 results in the recesses 68 having rounded ends. As noted above, the gate stacks 74 are formed by depositing a conductive material in the recesses 68, such as with an ALD process. The rounded ends of the recesses 68 are narrower than the main portions of the recesses 68, and the ALD process may have imperfect gap-filling properties. As such, voids 82 may be formed at ends of the gate stacks 74, proximate the rounded ends. The voids 82 are disposed a distance $D_4$ from the ends of the metal lines. In some embodiments, the distance $D_4$ is in the range of about 50 nm to about 90 nm.

In accordance with some embodiments, the gate contacts 78 are formed physically coupling portions of the gate stacks 74 that are substantially free from voids 82. The contact resistance of the gate contacts 78 may thus be decreased. During a design process, the distance $D_3$ is determined according to the width $W_2$ of the gate stacks 74 and the width $W_3$ of the gate contacts 78. In particular, the distance $D_3$ is greater than the distance $D_4$, and at least the sum of half of the width $W_2$ and half of the width $W_3$, e.g., $D_3$ is constrained according to $D_3>D_4$ and $D_3>0.5*W_2+0.5*W_3$. In some embodiments, the distance $D_3$ is in the range of about 91 nm to about 500 nm. As such, when the gate contacts 78 are formed, the voids 82 are laterally disposed between the gate contacts 78 and the ends of the metal lines. The distance $D_3$ is large enough to help avoid formation of the gate contacts 78 on the voids 82.

The distance $D_1$ between fins 52 at the ends of the metal lines may be larger, to accommodate the larger distance $D_3$. In particular, the distance $D_1$ in the embodiment of FIG. 9A is larger than the distance $D_1$ in the embodiments of FIGS. 7A and 7B. In some embodiments, the distance $D_1$ between fins 52 at the ends of the metal lines is in the range of about 442 nm to about 1000 nm.

FIG. 9B illustrates a gate contact 78 layout, in accordance with some other embodiments. FIG. 9B is a top-down view, showing some features of the structure of FIGS. 6A through 6C. The embodiment of FIG. 9B is similar to the embodiment of FIG. 9A, but includes gate stacks 74 of multiple widths. For example, a first set of gate stacks 74A may have a width $W_{2,1}$, and a second set of gate stacks 74B may have a width $W_{2,2}$, with the width $W_{2,1}$ being greater than the width $W_{2,2}$. In some embodiments, the width $W_{2,1}$ is in the range of about 67 nm to about 151 nm, and the width $W_{2,2}$ is in the range of about 67 nm to about 151 nm.

Figure 10:
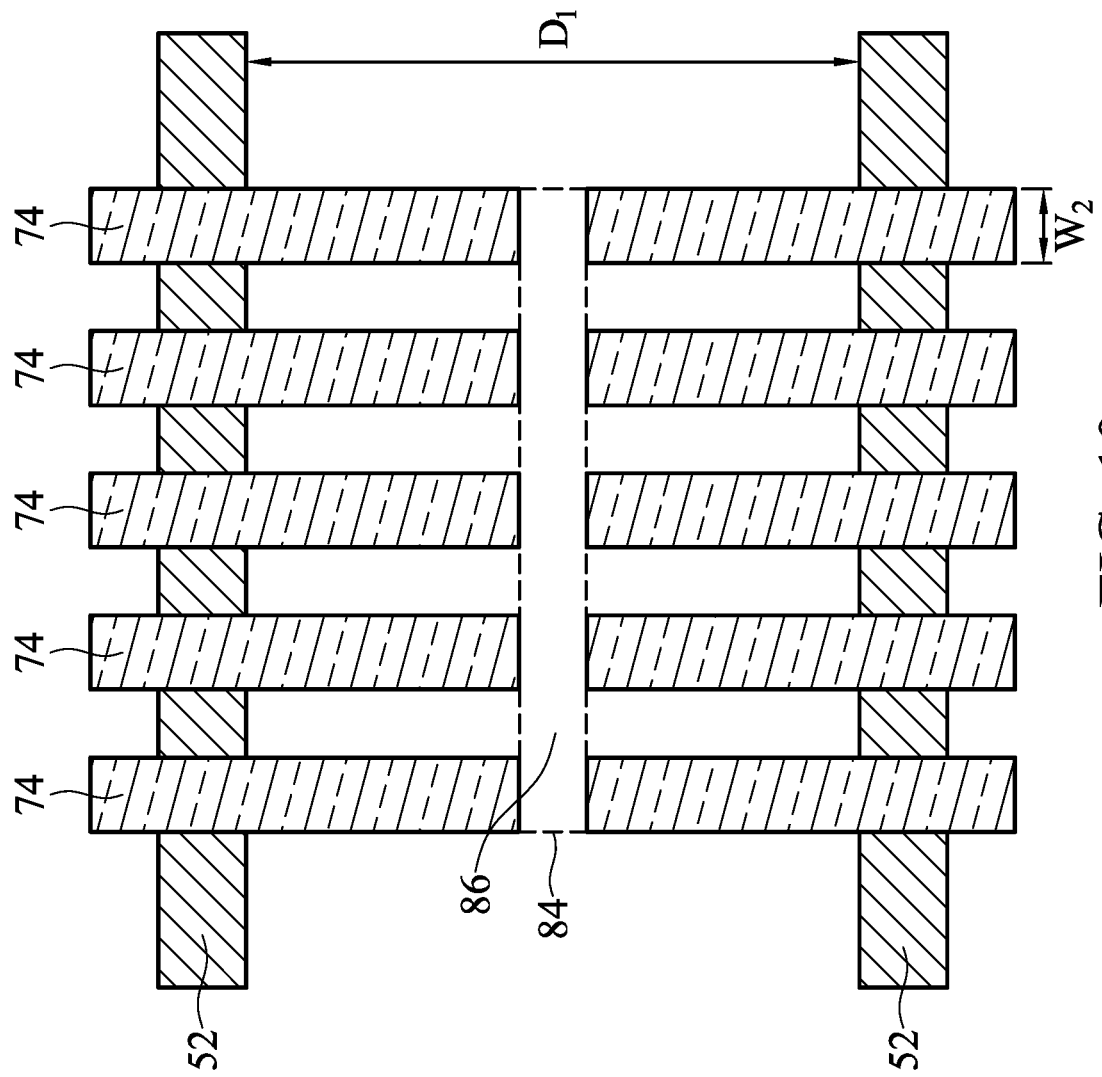
FIGS. 10 through 13 illustrate a gate contact layout, in accordance with some other embodiments.
Figure 11:
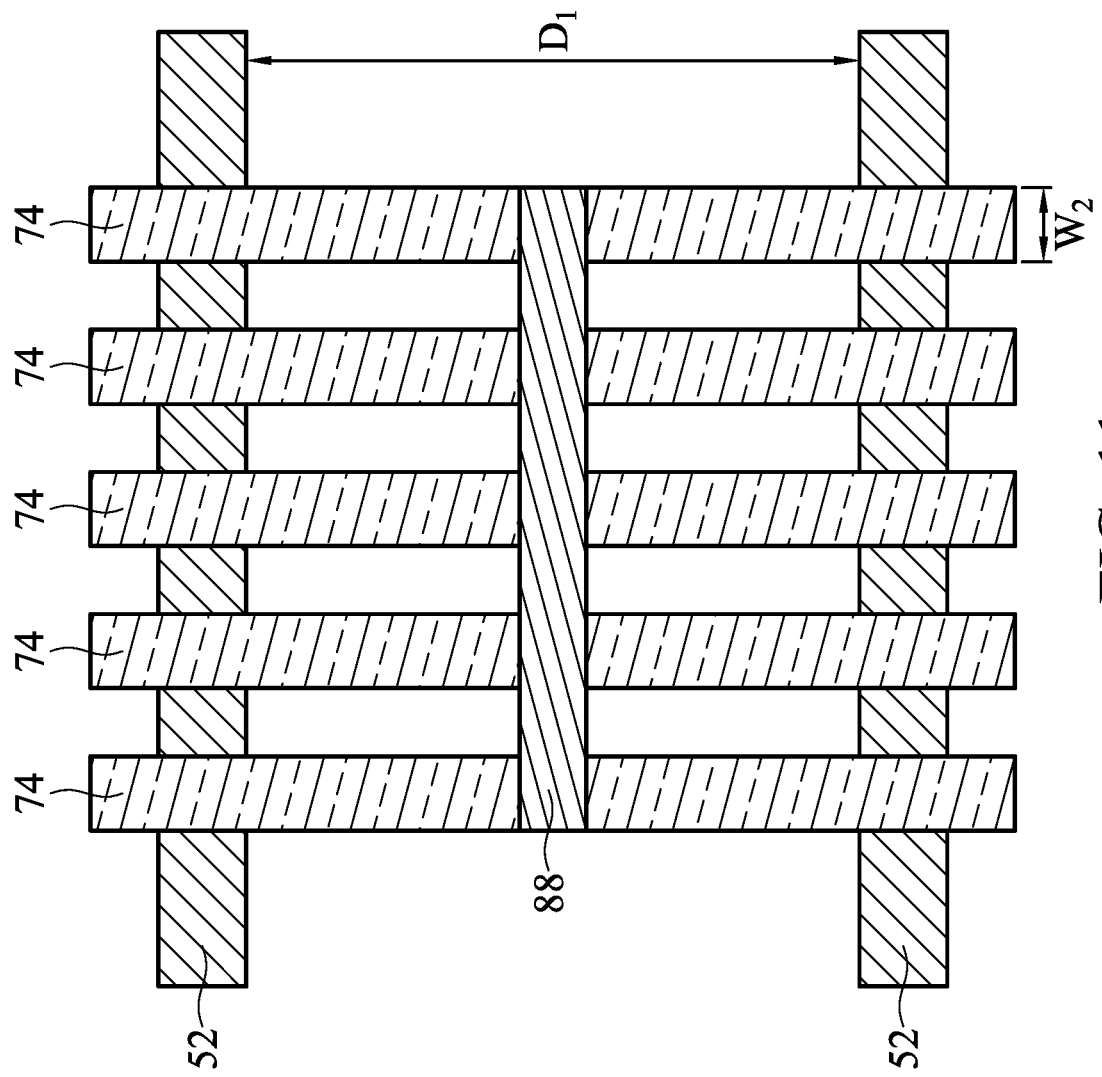
Figure 12:
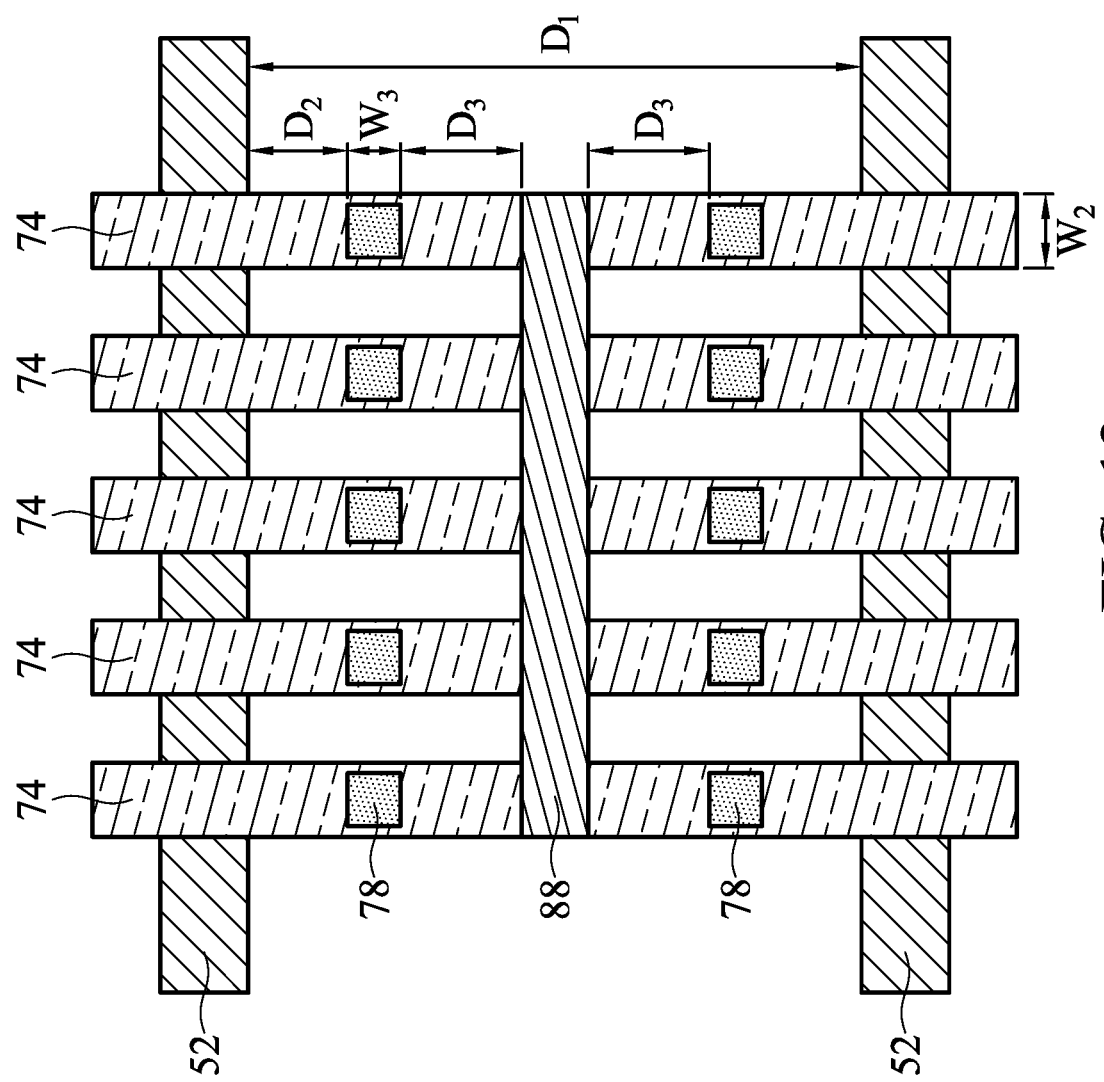
Figure 13:
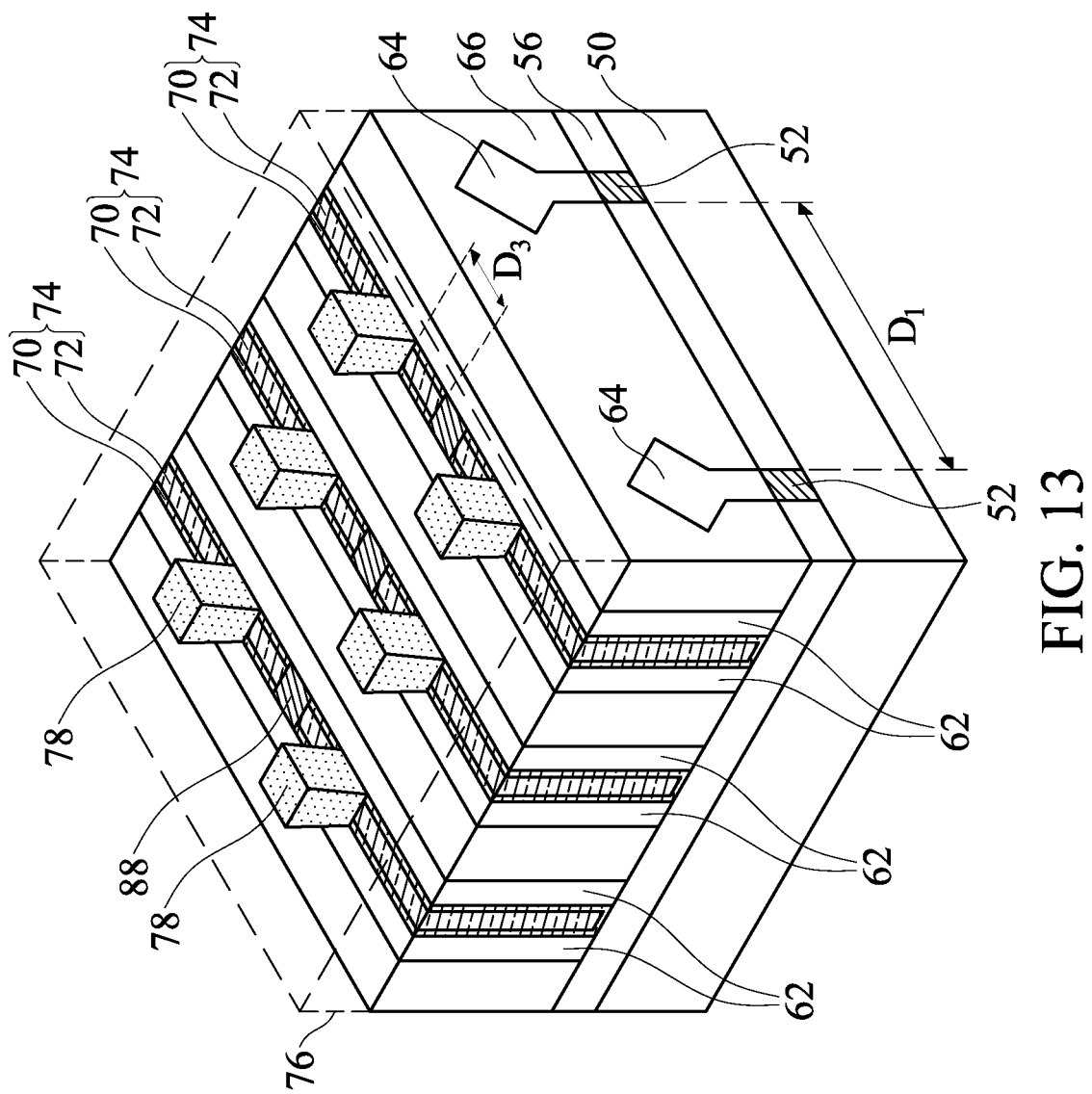

FIGS. 10 through 12 are top-down views of intermediate stages in a process for forming the gate contacts 78, in accordance with some embodiments. FIG. 13 is a three-dimensional view of the resulting structure. Multiple gate stacks 74 are shown, with each respective gate stack 74 initially being formed as a continuous metal line extending over two fins 52. The gate stacks 74 may be formed to originally span the fins 52 of multiple transistors (where each transistor may include one or a plurality of fins 52). The distance $D_1$ between fins 52 is large, to accommodate a line cut that will be subsequently performed. In particular, the distance $D_1$ in the embodiment of FIGS. 10 through 13 is larger than the distance $D_1$ in the embodiments of FIGS. 7A and 7B. In some embodiments, the distance $D_1$ between fins 52 is in the range of about 350 nm to about 1000 nm.

In FIG. 10, each respective gate stack 74 is cut in a region 84 to form an opening 86. The opening 86 can also be formed in dielectric layers around the gate stacks 74, such as the first ILD 66. After the cut, the continuous metal lines are broken into smaller metal lines. The cut may be performed by acceptable photolithography and etching processes. For example, a photoresist may be formed, and patterned to expose the region 84. One or more etching processes may then be performed on the gate stacks 74, using the patterned photoresist as an etching mask. The photoresist may then be removed, such as by an ashing process. After being cut, each gate stack 74 may span the fins 52 of a single transistor (where the transistor may include one or a plurality of fins 52). By forming a continuous metal line and cutting it, the formation of voids at the ends of the metal lines may be avoided. The ends of each gate stack 74 are thus free from voids.

In FIG. 11, the opening 86 is filled with a dielectric material 88. The dielectric material 88 may be silicon nitride, silicon oxynitride, silicon oxide, silicon carbide, or the like, and may be formed by blanket depositing a dielectric layer and planarizing the dielectric layer to remove portions of the dielectric material 88 outside of the opening 86. Remaining portions of the dielectric material 88 isolate the cut metal lines from one another.

In FIG. 12, the gate contacts 78 are formed, contacting the cut gate stacks 74. The gate contacts 78 physically couple the cut gate stacks 74, and are disposed a same distance $D_3$ from the ends of the metal lines (e.g., from the dielectric material 88). Because the formation of voids has been avoided, the distance $D_3$ in the embodiment of FIGS. 10 through 13 may be smaller than the distance $D_3$ in the embodiments of FIGS. 9A and 9B. In some embodiments, the distance $D_3$ is in the range of about 91 nm to about 500 nm. The gate contacts 78 may be formed at the ends of the cut gate stacks 74 without the need to avoid contacting voids.

Embodiments may achieve advantages. By constraining the distance $D_2$ between the fins 52 and gate contacts 78 (see FIG. 7B) for fins 52 spaced by a large distance $D_1$, formation of the gate contacts 78 on voids 82 may be avoided. By increasing the distance $D_3$ between the gate contacts 78 and the ends of the gate stack metal lines, formation of the gate contacts 78 on voids 82 may be further avoided. The contact area of the gate contacts 78 may thus be increased, thereby decreasing the contact resistance of the gate contacts 78. Finally, by initially forming longer gate stack metal lines and cutting the lines, the formation of voids may be avoided, and the gate contacts 78 may be formed at the ends of the cut gate stacks 74 without the need to avoid contacting voids.

In an embodiment, a method includes: forming a first fin extending from a substrate; forming a second fin extending from the substrate, the second fin being spaced apart from the first fin by a first distance; forming a metal gate stack over the first fin and the second fin; depositing a first inter-layer dielectric over the metal gate stack; and forming a gate contact extending through the first inter-layer dielectric to physically contact the metal gate stack, the gate contact being laterally disposed between the first fin and the second fin, the gate contact being spaced apart from the first fin by a second distance, where the second distance is less than a second predetermined threshold when the first distance is greater than or equal to a first predetermined threshold.

In some embodiments of the method, the metal gate stack has multiple widths, and a portion of the metal gate stack with a narrowest width of the multiple widths is disposed over the first fin. In some embodiments of the method, the first predetermined threshold is in a range of 35 to 40 times the narrowest width of the metal gate stack. In some embodiments of the method, the second predetermined threshold is in a range of 10 to 13 times the narrowest width of the metal gate stack. In some embodiments of the method, the narrowest width of the metal gate stack is in a range of 6 nm to 300 nm. In some embodiments, the method further includes: depositing a second inter-layer dielectric around the metal gate stack, where after the second inter-layer dielectric is formed, a first portion of the metal gate stack includes a void. In some embodiments of the method, the gate contact physically contacts a second portion of the metal gate stack, the first portion of the metal gate stack being distal the first fin, the second portion of the metal gate stack being proximate the first fin. In some embodiments of the method, the first portion of the metal gate stack and the second portion of the metal gate stack are laterally disposed between the first fin and the second fin.

In an embodiment, a method includes: forming a first fin extending from a substrate; forming a dummy gate stack over the first fin; depositing a first inter-layer dielectric along the dummy gate stack; replacing the dummy gate stack with a metal gate stack, an end of the metal gate stack being rounded, the metal gate stack including a void, the void being disposed a first distance from the rounded end of the metal gate stack; forming a second inter-layer dielectric over the metal gate stack and the first inter-layer dielectric; and forming a gate contact extending through the second inter-layer dielectric to physically contact a first portion of the metal gate stack, the first portion of the metal gate stack being disposed a second distance from the rounded end of the metal gate stack, the second distance being greater than the first distance.

In some embodiments of the method, the first distance is in a range of 50 nm to 90 nm, and the second distance is in a range of 91 nm to 500 nm. In some embodiments of the method, the first fin has a first width, the gate contact has a second width, and the second distance is greater than a sum of half of the first width and half of the second width. In some embodiments of the method, the first fin is adjacent the rounded end of the metal gate stack. In some embodiments of the method, replacing the dummy gate stack with the metal gate stack includes: etching the dummy gate stack to form a recess having a rounded end; and filling the recess with a metal, the void being formed during the filling.

In an embodiment, a method includes: forming a first fin extending from a substrate; forming a second fin extending from the substrate; forming a metal line over the first fin and the second fin; cutting the metal line along a first region to separate the metal line into a first metal gate stack and a second metal gate stack, the first metal gate stack being over the first fin, the second metal gate stack being over the second fin; depositing a first inter-layer dielectric over the first metal gate stack and the second metal gate stack; forming a first gate contact extending through the first inter-layer dielectric to physically contact the first metal gate stack, the first gate contact being disposed a first distance from the first region; and forming a second gate contact extending through the first inter-layer dielectric to physically contact the second metal gate stack, the second gate contact being disposed the first distance from the first region.

In some embodiments of the method, cutting the metal line includes: etching the metal line in the first region to form a first opening through the metal line; and forming a dielectric material in the first opening. In some embodiments of the method, the first inter-layer dielectric is further deposited over the dielectric material. In some embodiments, the method further includes: forming gate spacers adjacent the metal line, the dielectric material extending between the gate spacers. In some embodiments, the method further includes: forming a second inter-layer dielectric around the gate spacers. In some embodiments of the method, the first fin and the first metal gate stack are part of a first transistor, and where the second fin and the second metal gate stack are part of a second transistor. In some embodiments of the method, ends of the first metal gate stack and the second metal gate stack are free from voids.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an inter-layer dielectric over a first metal gate and a second metal gate, the first metal gate disposed over a first fin and a second fin, the second fin being spaced apart from the first fin by a first distance in a top-down view, the second metal gate disposed over a third fin and a fourth fin, the fourth fin being spaced apart from the third fin by a second distance in the top-down view, the second distance greater than the first distance;
   forming a first gate contact extending through the inter-layer dielectric to contact the first metal gate, the first gate contact being spaced apart from the first fin by a third distance in the top-down view; and
   forming a second gate contact extending through the inter-layer dielectric to contact the second metal gate, the second gate contact being spaced apart from the third fin by a fourth distance in the top-down view, the fourth distance less than the third distance.

2. The method of claim 1, wherein the first metal gate has a first width in the top-down view, the second metal gate has a second width in the top-down view, the first distance is less than 35 to 40 times the first width, and the second distance is greater than 35 to 40 times the second width.

3. The method of claim 1, wherein the first metal gate has a first width in the top-down view, the second metal gate has a second width in the top-down view, the third distance is greater than 10 to 13 times the first width, and the fourth distance is less than 10 to 13 times the second width.

4. The method of claim 1, wherein the first metal gate has a first width in the top-down view, the second metal gate has a second width in the top-down view, and the first width and the second width are each in a range of 6 nm to 300 nm.

5. The method of claim 1, wherein the second metal gate comprises a void and the first metal gate is free from voids.

6. The method of claim 1, wherein a first portion of the second metal gate comprises a void, a second portion of the second metal gate is free from voids, the second gate contact physically contacts the second portion of the second metal gate, and the first metal gate is free from voids.

7. The method of claim 6, wherein the second portion of the second metal gate is disposed between the first portion of the second metal gate and the third fin.

8. The method of claim 1, wherein the first gate contact is disposed between the first fin and the second fin in the top-down view, and the second gate contact is disposed between the third fin and the fourth fin in the top-down view.

9. A method comprising:
depositing an inter-layer dielectric over a first metal gate, the first metal gate disposed over a first fin, the first metal gate having a rounded end, a first portion of the first metal gate comprising a void, the void being disposed a first distance from the rounded end of the first metal gate in a top-down view; and
forming a gate contact extending through the inter-layer dielectric to physically contact a second portion of the first metal gate, the gate contact disposed between the first fin and the void in the top-down view, the gate contact being disposed a second distance from the rounded end of the first metal gate in the top-down view, the second distance being greater than the first distance.

10. The method of claim 9, wherein the first metal gate has a first width in the top-down view, the gate contact has a second width in the top-down view, and the second distance is greater than a sum of half of the first width and half of the second width.

11. The method of claim 9 further comprising:
depositing the inter-layer dielectric over a second metal gate, the second metal gate disposed over a second fin, the second metal gate separated from the first metal gate.

12. The method of claim 11, wherein the first fin is adjacent the rounded end of the first metal gate, and wherein the second fin is adjacent a rounded end of the second metal gate.

13. The method of claim 11, wherein the first distance is in a range of 50 nm to 90 nm, the second distance is in a range of 91 nm to 500 nm, and a third distance between the first fin and the second fin is in a range of 442 nm to 1000 nm.

14. A method comprising:
forming a design comprising:
placing a first gate contact over a first metal gate, the first metal gate disposed over a first fin and a second fin, the second fin being spaced apart from the first fin by a first distance in a top-down view, the first gate contact placed a second distance from the second fin in the top-down view; and
placing a second gate contact over a second metal gate, the second metal gate disposed over a third fin and a fourth fin, the fourth fin being spaced apart from the third fin by a third distance in the top-down view, the second gate contact placed a fourth distance from the fourth fin in the top-down view, the third distance greater than the first distance, the fourth distance less than the second distance;
storing the design in a cell library; and
manufacturing a transistor using the cell library.

15. The method of claim 14, wherein forming the design comprises:
constraining the first distance to be less than a first predetermined threshold; and
constraining the fourth distance to be less than a second predetermined threshold in response to the third distance being greater than the first predetermined threshold.

16. The method of claim 15, wherein the first metal gate and the second metal gate have a width in the top-down view, the first predetermined threshold is in a range of about 35 to about 40 times the width of the second metal gate, and the second predetermined threshold is in a range of about 10 to about 13 times the width of the second metal gate.

17. The method of claim 15, wherein a ratio of the first predetermined threshold to the second predetermined threshold is in a range of about 3 to about 5.

18. The method of claim 15, wherein the first metal gate and the second metal gate have a width in the top-down view, the first predetermined threshold is about 216 nm, the second predetermined threshold is about 70 nm, and the width of the second metal gate is about 6 nm.

19. The method of claim 14, wherein the first gate contact is placed between the first fin and the second fin in the top-down view, and the second gate contact is placed between the third fin and the fourth fin in the top-down view.

20. The method of claim 14, wherein when manufacturing the transistor, a void is formed in the second metal gate and no voids are formed in the first metal gate.

* * * * *

UNITED STATES PATENT AND TRADEMARK OFFICE
CERTIFICATE OF CORRECTION

| | |
|---|---|
| PATENT NO. | : 11,721,590 B2 |
| APPLICATION NO. | : 17/862628 |
| DATED | : August 8, 2023 |
| INVENTOR(S) | : Wu et al. |

It is certified that error appears in the above-identified patent and that said Letters Patent is hereby corrected as shown below:

On the Title Page

Item [72], Line 6, delete "ZhudongTown" and insert -- Zhudong Town --.

Signed and Sealed this
Twenty-fourth Day of October, 2023

Katherine Kelly Vidal
*Director of the United States Patent and Trademark Office*